United States Patent [19]

Eto

[11] 3,842,416

[45] Oct. 15, 1974

[54] INTEGRATING ANALOG-TO-DIGITAL CONVERTER

[76] Inventor: Tetsutaro Eto, 16-14, Kamisoshigaya-3, Tokyo, Japan

[22] Filed: May 9, 1972

[21] Appl. No.: 251,678

[30] Foreign Application Priority Data

May 11, 1971 Japan ................................ 46-31371

[52] U.S. Cl....... 340/347 NT, 340/347 AD, 235/183

[51] Int. Cl. ............................................ H03k 13/20

[58] Field of Search............... 340/347 AD, 347 NT; 235/183; 324/990

[56] References Cited

UNITED STATES PATENTS

| | | | |
|---|---|---|---|
| 3,267,458 | 8/1966 | Anderson et al. | 340/347 NT |
| 3,368,149 | 2/1968 | Wasserman | 340/347 NT |
| 3,480,948 | 11/1969 | Lord | 340/347 NT |
| 3,500,109 | 3/1970 | Sugiyama et al. | 340/347 NT |
| 3,525,093 | 8/1970 | Marshall | 340/347 NT |
| 3,541,320 | 11/1970 | Beall | 340/347 NT |
| 3,564,538 | 2/1971 | Bondzeit et al. | 340/347 NT |
| 3,566,397 | 2/1971 | Walton | 340/347 NT |
| 3,566,458 | 2/1971 | Reid | 340/347 NT |
| 3,735,394 | 5/1973 | Eto | 340/347 NT |

*Primary Examiner*—Charles D. Miller
*Attorney, Agent, or Firm*—Marshall & Yeasting

[57] ABSTRACT

An integrating analog-to-digital converter comprising: an analog input signal source, first and second analog reference signal sources, integrating means common to the analog input signal source and the first and second analog reference signal sources, a first analog reference signal from the first analog reference signal source having such a polarity as to increase the integrated output from the integrating means in a positive direction in accordance with the supply of the first analog reference signal to the integrating means and the second analog reference signal from the second analog reference signal source being opposite in polarity to the first analog reference signal, a clock pulse source, a pulse counter, means for supplying the integrating means with an analog input signal from the analog input signal source in a predetermined analog input signal integrating time period determined by a clock pulse from the clock pulse source, means for supplying the integrating means with the second analog reference signal or the first analog reference signal according as the integrated output is positive or negative at the time of completion of the integration of the analog input signal by the integrating means in a first one of *n*'s reference signal integrating time periods sequentially following the analog input signal integrating time period and determined by the clock pulse, (*n* being an integer more than 2 and the *j*th analog reference signal integrating time period being $1/_2(j-1)$ times the first one and $j = 2, 3, \ldots n$), means for supplying the integrating means with the second analog reference signal or the first analog reference signal according as the integrated output at the time of termination of the $(j-1)$th analog reference signal integrating time period is positive or negative, and means for supplying the pulse counter with the clock pulse from the clock pulse source in the *j*th analog reference signal integrating time period when the integrated output from the integrating means at the time of completion of integration of the analog input signal is positive (or negative) and when the integrated output from the integrating means is positive (or negative) at the time of termination of the $(j-1)$th analog reference signal integrating time period.

6 Claims, 4 Drawing Figures

PATENTED OCT 15 1974

3,842,416

SHEET 2 OF 7

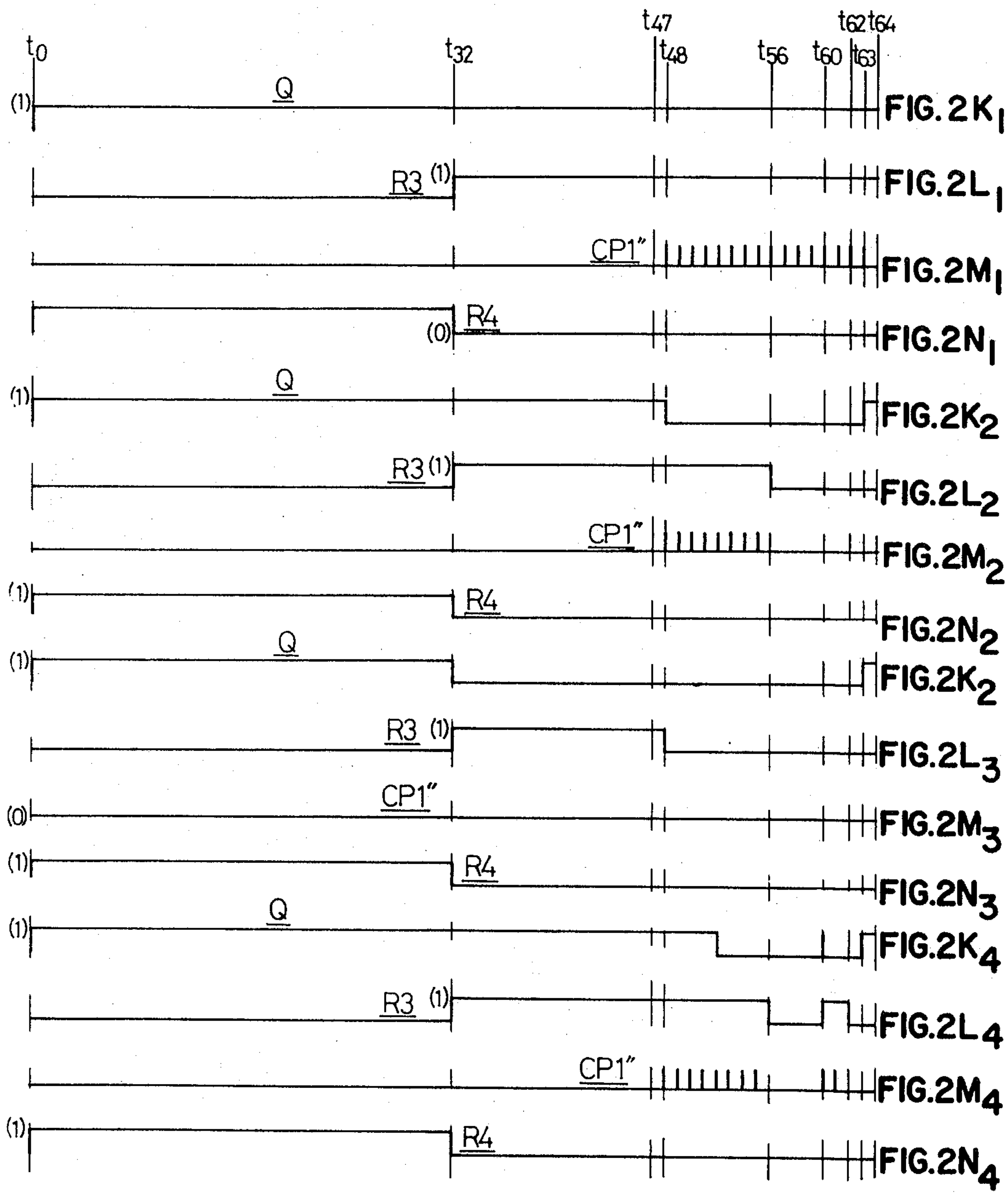
FIG. 2K1, FIG. 2L1, FIG. 2M1, FIG. 2N1, FIG. 2K2, FIG. 2L2, FIG. 2M2, FIG. 2N2, FIG. 2K2, FIG. 2L3, FIG. 2M3, FIG. 2N3, FIG. 2K4, FIG. 2L4, FIG. 2M4, FIG. 2N4

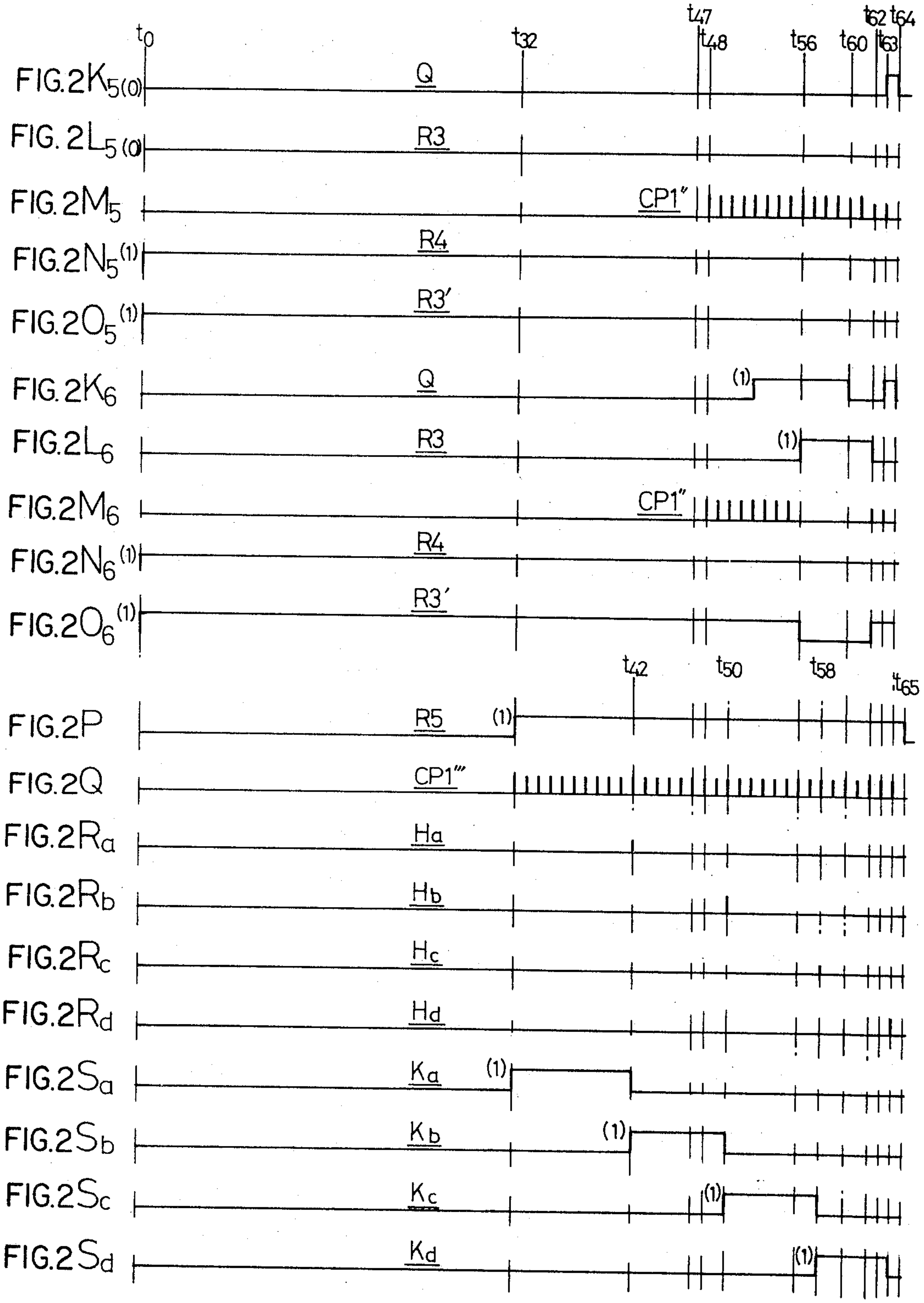
FIG. 2K5(0), FIG. 2L5(0), FIG. 2M5, FIG. 2N5(1), FIG. 2O5(1), FIG. 2K6, FIG. 2L6, FIG. 2M6, FIG. 2N6(1), FIG. 2O6(1), FIG. 2P, FIG. 2Q, FIG. 2Ra, FIG. 2Rb, FIG. 2Rc, FIG. 2Rd, FIG. 2Sa, FIG. 2Sb, FIG. 2Sc, FIG. 2Sd

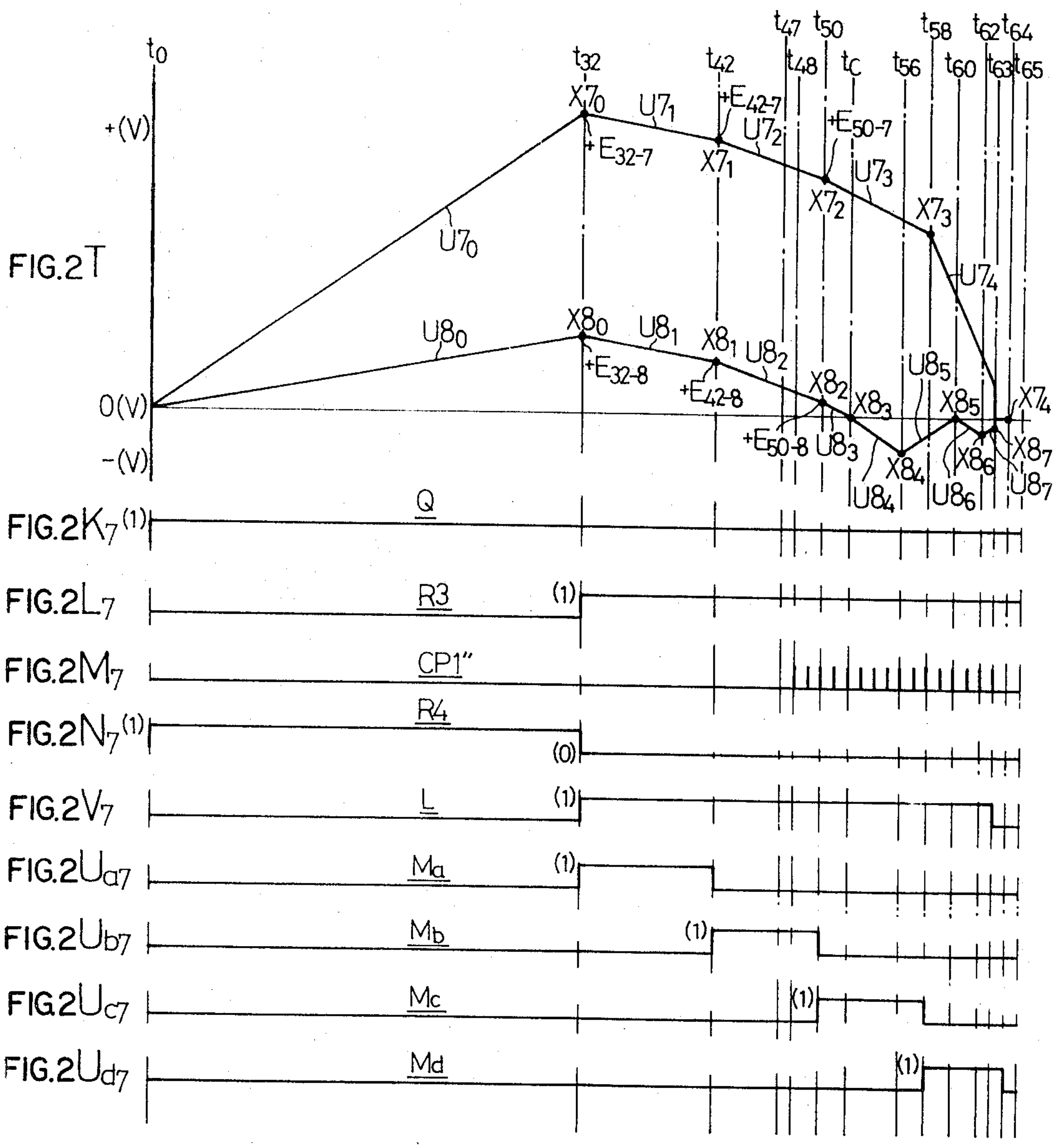
FIG.2T, FIG.2K7(1), FIG.2L7, FIG.2M7, FIG.2N7(1), FIG.2V7, FIG.2Ua7, FIG.2Ub7, FIG.2Uc7, FIG.2Ud7

FIG. 2K8, FIG. 2L8, FIG. 2M8, FIG. 2N8, FIG. 2V8, FIG. 2Ua8, FIG. 2Ub8, FIG. 2Uc8, FIG. 2Ud8
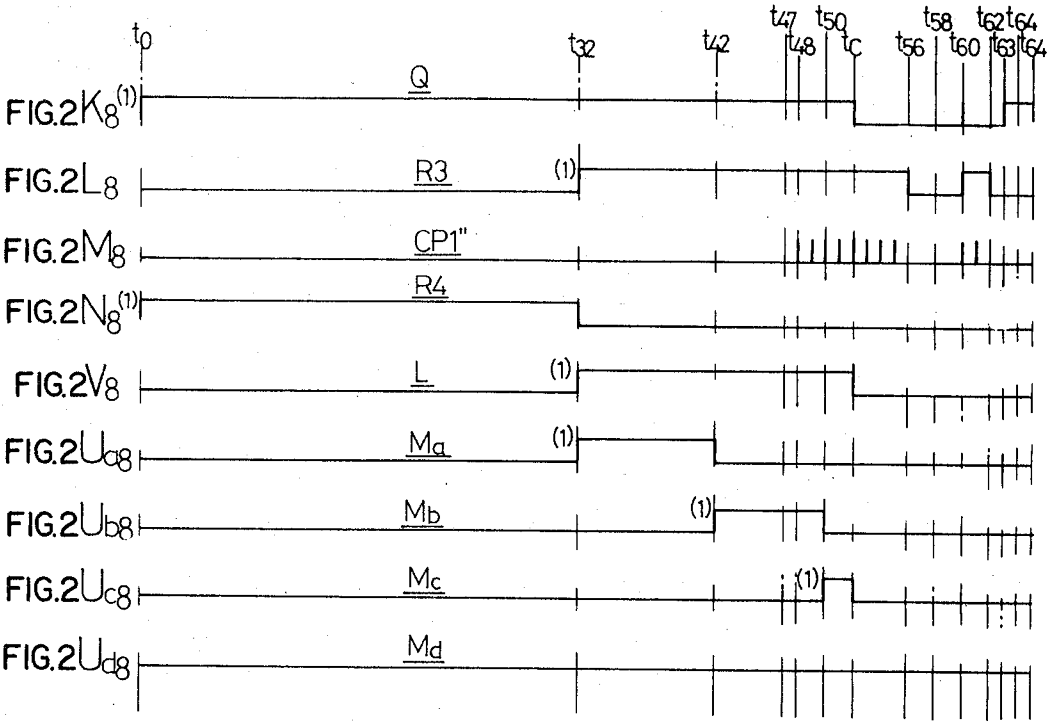
FIG. 3
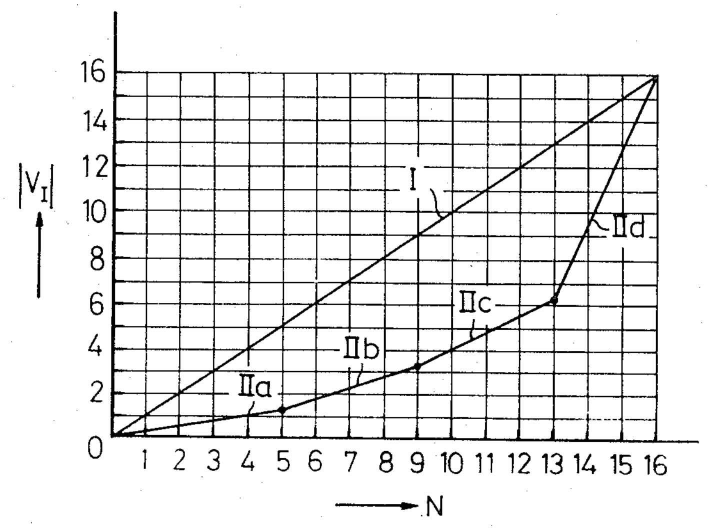

INTEGRATING ANALOG-TO-DIGITAL CONVERTER

BACKGROUND OF THE INVENTION

1. Field of the Invention

This invention relates to an integrating analog-to-digital converter adapted such that valve of an analog input signal integrated for a predetermined period of time is converted into a digital valve.

2. Description of the Prior Art

In conventional types of analog-to-digital converters an analog input signal is integrated and a digital output corresponding to the level of the analog input signal is produced based on the integrated output. However, the conventional converters are constructed on the assumption that no change occurs in the level and/or polarity of the analog input signal in the integration thereof. Accordingly, these prior converters cannot be used in the case where some changes are expected to occur in the level and/or polarity of the analog input signal during its integration.

SUMMARY OF THE INVENTION

One object of this invention is to provide an analog-to-digital converter which is adapted to obtain a digital output in accordance with a valve of the analog input signal integrated for a predetermined period of time. The analog-to-digital converter of this invention can be used irrespective of a change in the level and/or polarity of the analog input signal during its integration. In the analog-to-digital converter of this invention a digital output is provided in accordance with the level of the analog input signal when no change occurs in the level and/or polarity of the analog input signal during its integration.

Another object of this invention is to provide a analog-to-digital converter which is designed to produce a digital output of a valve proportional to a valve of an analog input signal integrated for a predetermined period of time.

Another object of this invention is to provide an analog-to-digital converter which is adapted to produce a digital output of a valve corresponding to a valve of an analog input signal integrated for a predetermined period of time best corrected in accordance with the integrated valve.

Still another object of this invention is to provide an analog-to-digital converter which is adapted to produce a digital output of a valve of an analog input signal integrated for a predetermined period of time such that the relation between the integrated value of the analog input signal and the digital output is obtained with a broken line characteristic.

Other objects, features and advantages of this invention will become apparent from the following description taken in conjunction with the accompanying drawings.

BRIEF DESCRIPTION OF THE DRAWINGS

FIGS. 2A to 2U*d8* are a series of signal waveform diagrams, for explaining the examples of FIGS. 1 and 4;

FIG. 3 is a graph showing the relationship of the number of pulses counted to an analog input voltage.

DESCRIPTION OF THE PREFERRED EMBODIMENTS

Figure 1:
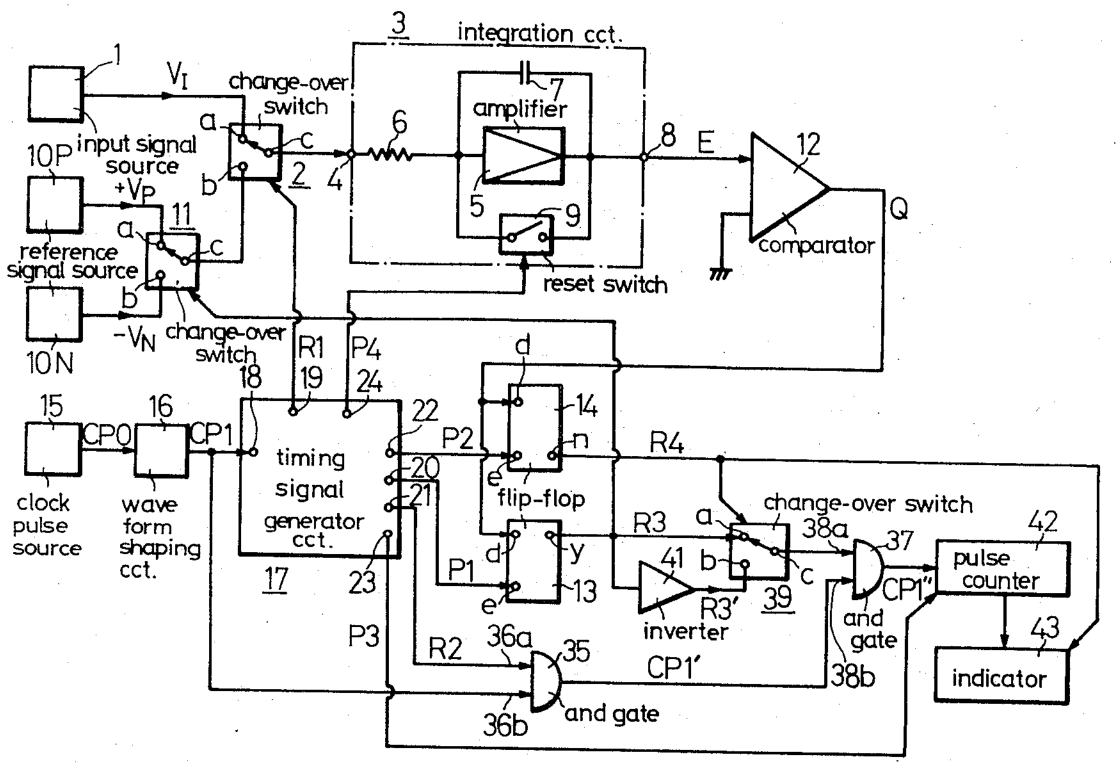
FIG. 1 is a block diagram showing an example of an integrating analog-to-digital converter according to this invention.

FIG. 1 illustrates one example of this invention. In the figure, reference numeral 1 indicates an analog input signal source, from which an analog input voltage $V_I$ is supplied to an input terminal 4 of an integration circuit 3 through a fixed contact *a* and a movable contact *c* of a change-over switch 2. The integration circuit 3 includes an amplifier 5, an integrating resistor 6 and an integrating capacitor 7 and the amplifier 5 is connected at input side to the input terminal 4 through the integrating resistor 6 and at output side to the input side thereof through the integrating capacitor 7 constituting the so-called Miller integrator construction. An output terminal 8 of the integration circuit 3 is connected to the output side of the amplifier 5 and a reset switch 9 is connected between the input and output sides of the amplifier 5.

Reference numerals 10P and 10N designate first and second analog reference signal sources, respectively. A positive reference voltage $+V_P$ of a constant level is supplied from the one signal source 10P to the input terminal 4 of the integration circuit through fixed and movable contacts *a* and *c* of a change-over switch 11 and a fixed contact *b* and the movable contact *c* of the change-over swtich 2. While, a negative reference voltage $-V_N$ of a constant level is supplied from the other signal source 10N to the input terminal 4 of the integration circuit 3 through a fixed contact *b* and the movable contact *c* of the change-over switch 11 and the fixed and movable contacts *b* and *c* of the changeover switch 2. In this case, the voltages $+V_P$ and $-V_N$ are selected to bear a relationship $|+V_P|=|-V_N|$ therebetween.

An integrated output E derived from the output terminal 8 is fed to a comparator circuit 12 which utilizes zero voltage as the reference and is adapted to provide a compared output Q of binary indication which provides an indication "1" when the integrated output E is positive or zero and "0" when the output E is negative. The compared output Q is fed to terminals *d* of D-type flip-flop circuits 13 and 14.

Figures 2A, 2B, 2C, 2D, 2E, 2F, 2G, 2H, 2I, 2J:
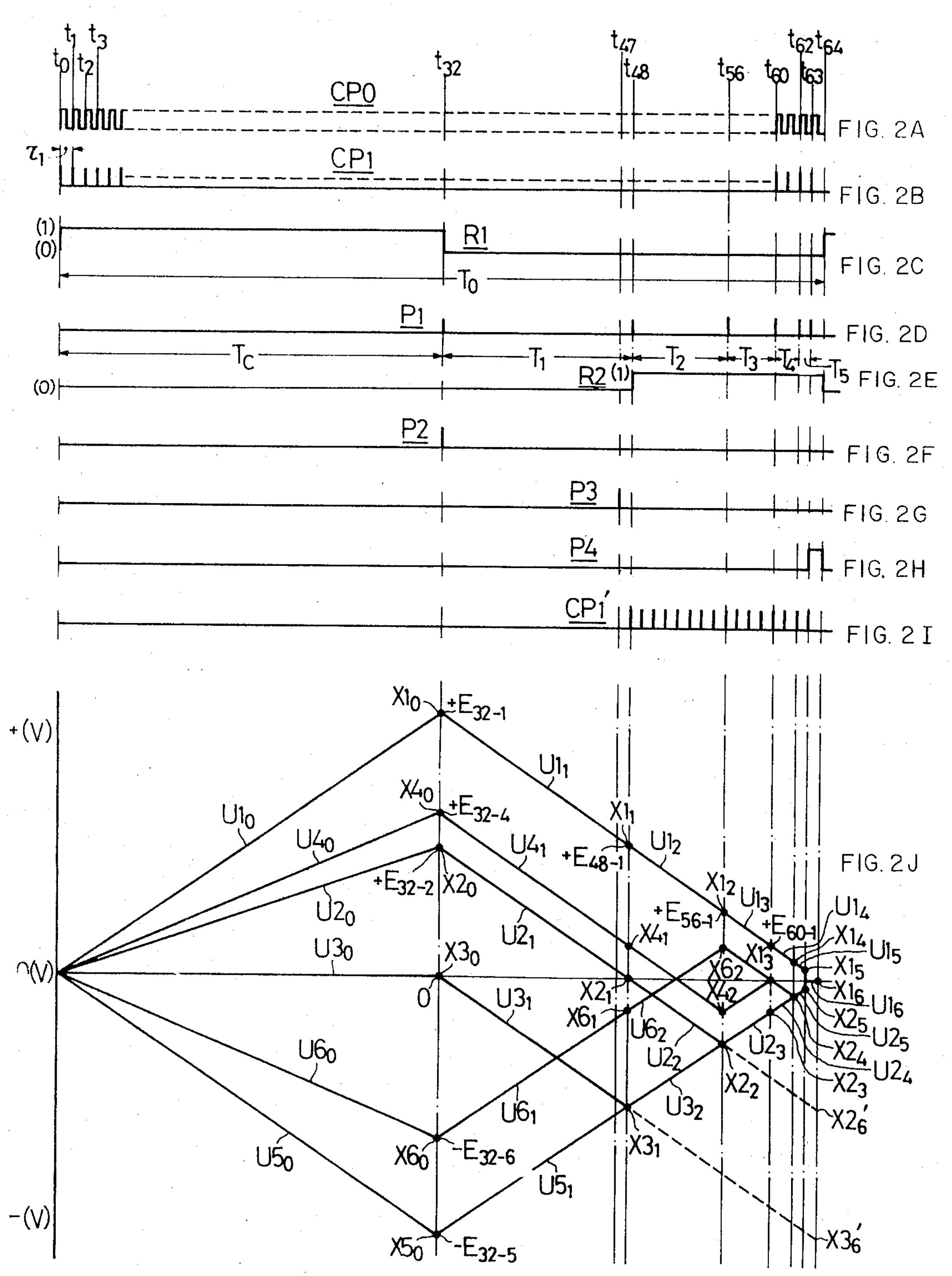

Reference numeral 15 indicates a clock pulse source, from which a clock pulse train CP0 of a period $\tau_1$ such as shown in FIG. 2A is supplied to a waveform shaping circuit 16 to derive therefrom a clock pulse CP1 such as depeicted in FIG. 2B which is produced at the time corresponding to the leading edge of each pulse of the pulse train CP0. The clock pulse CP1 thus obtained is applied to an input terminal 18 of a timing signal generator circuit 17, which has output terminals 19, 20, 21, 22, 23 and 24. Let it be assumed that the pulses of the pulse train CP1 are sequentially produced at times $t_0$, $t_1$, $t_2$, . . . The timing signal generator circuit 17 is adapted to derive a rectangular wave R1 for timing use such as shown in FIG. 2C from the output terminal 19, a pulse train P1 such as shown in FIG. 2D from the output terminal 20, a rectangular wave R2 such as shown in FIG. 2E from the output terminal 21, a pulse P2 such as shown in FIG. 2F from the output terminal 22, a reset pulse P3 such as shown in FIG. 2G from the output terminal 23, and a reset pulse P4 such as shown in FIG. 2H from the output terminal 24. The rectangular wave R1 for timing use is such as depicted in FIG. 2C which has a value "1" of the binary indication for periods of time represented by $32 \cdot \tau_1 = T_C$ between the times $t_0$ and $t_{32}$, between $t_{64}$ and $t_{96}$, between $t_{128}$ and $t_{160}$. . . and a valve "0" for the other remaining period and has a period $T_0$ represented by $64 \cdot \tau_1 = 2 \cdot T_C$. The pulse train P1 is such as depicted in FIG. 2D which consists of pulses produced at the times $t_{32}$, $t_{48}$, $t_{56}$, $t_{60}$, $t_{62}$, $t_{63}$, $t_{96}$, $t_{112}$, $t_{120}$, $t_{124}$, $t_{126}$, $t_{127}$, . . . and having the period $T_0$, respectively. The rectangular wave $R_2$ for timing use is such as depicted in FIG. 2E which as a value "1" of the binary indication for periods from $t_{48}$ to $t_{64}$, $t_{112}$ to $t_{128}$, . . . and a valve "0" for the other remaining periods of time and has the period $T_0$. The pulse P2 is such as depicted in FIG. 2F which is produced at the times $t_{32}$, $t_{96}$, . . . and has the period $T_0$. The reset pulse P3 is such as depicted in FIG. 2G which is produced at the times $t_{47}$, $t_{111}$, . . . , respectively, and has the period $T_0$. The reset pulse P4 is such as depicted in FIG. 2H which has the value "1" of the binary indication for periods of time from $t_{63}$ to $t_{64}$, $t_{127}$ to $t_{128}$, . . . and the value "0" for the other remaining periods of time and has the period $T_0$. If a first period between first and second pulses of the pulse train P1 is taken as the reference $T_1$, the time of second, third, fourth and fifth periods $T_2$, $T_3$, $T_4$ and $T_5$ between the second and third pulses, between the third and fourth pulses, between the fourth and fifth pulses and between the fifth and sixth pulses of the pulse train P1 bear relationships such as $T_2 = T_1/2 = T_1/2^1$, $T_3 = T_1/4 = T_1/2^2$, $T_4 = T_1/8 = T_1/2^3$ and $T_5 = T_1/16 = T_1/2^4$, respectively.

The change-over switch 2 is designed to be controlled by the rectangular wave R1 from the output terminal 19 of the timing signal generator circuit 17 in such a manner that the movable contact *c* may lie on the fixed contacts *a* and *b* when the rectangular wave R1 has the values "1" and "0" respectively. Further, the reset switch 9 of the aforementioned integration circuit 3 is adapted to be closed by the reset pulse P4 derived from the output terminal 24 of the switching signal generator circuit 17. Moreover, the pulse train P1 and the pulse P2 are applied as trigger pulse trains to trigger pulse input terminals *e* of the aforesaid flip-flop circuits 13 and 14 from the output terminals 20 and 22 of the timing signal generator circuit 17, respectively. In this case, when the pulse of the pulse train P1 is applied to the terminal *e* of the flip-flop circuit 13 which the compared output Q fed to its terminal *d* from the comparator circuit 12 has the value "1," the flip-flop circuit 13 is set and when the pulse of the pulse train P1 is applied to the terminal *e* while the compared output Q fed to the terminal *d* has the value "0" the flip-flop circuit 13 is reset. The flip-flop circuit 13 derives from its "yes" output terminal *y* a rectangular wave output R3 which has a value "1" of binary indication while the circuit is set and has a value "0" while the circuit 13 is reset. The change-over switch 11 above mentioned is adapted to be controlled by the output R3 such that the movable contact *c* of the switch 11 may lie on its fixed contacts *a* and *b* when the output R3 has the values "1" and "0", respectively. When the pulse P2 is fed to the terminal *e* of the flip-flop circuit 14 while the compared output Q applied to its terminal *d* from the comparator circuit 12 has the value "1," the flip-flop circuit 14 is set and when the pulse P2 is applied to the terminal *e* while the compared output Q fed to the terminal *d* has the value "0," the flip-flop circuit 14 is reset. The flip-flop circuit 14 derives from its "not" output terminal *n* a rectangular wave output R4 which has a value "0" of binary indication while the circuit is set and has a value "1" while it is reset.

The rectangular wave R2 derived at the output terminal 21 of the timing signal generator circuit 17 is applied to one input line 36*a* of an "and" gate circuit 35 having two inputs, while the clock pulse train CP1 derived from the waveform shaping circuit 16 is applied to the other input line 36*b* of the "and" gate circuit 35. While the rectangular wave R2 has the value "1," one portion of the clock pulse train CP1 passes through the gate circuit 35 to provide a clock pulse train CP1′ such as shown in FIG. 21, which is supplied to one input line 38*b* of an "and" gate circuit 37 having two inputs. While, the output R3 derived at the "yes" output terminal *y* of the aforesaid flip-flop circuit 13 is applied to the other input line 38*a* of the "and" gate circuit 37 through fixed and movable contacts *a* and *c* of a change-over switch 39.

One portion of the output R3 at the output terminal *y* of the flip-flop circuit 13 is fed to an inverter circuit 41 to derive therefrom an output R3′ which is opposite in polarity to the output R3 (in the case of the output R3 being "1," the output R3′ is "0" and, in the case of the former being "0," the latter "1"). The output R3′ thus obtained is fed to the input line 38*a* of the "and" gate circuit 37 through the fixed and movable contacts *b* and *c* of the change-over switch 39. In this case, the change-over switch 39 is designed to be switchingly controlled so that its movable contact c may lie on the fixed contacts *a* and *b* while the output R4 derived from the "not" output terminal *n* of the flip-flop circuit 14 has the values "0" and "1," respectively.

In the period during which the output R3 and R3′ fed to the input line 38*a* of the "and" gate circuit 37, has the value "1," the gate circuit 37 permits the passage therethrough of the clock pulse train CP1′ fed thereto from the "and" gate circuit 35 to provide a clock pulse train CP1″, which is supplied to a pulse counter 42. In this case, the pulse counter 42 is constructed so that the content of counting is reset by the reset pulse P3 derived from the output terminal 23 of the timing signal generator circuit 17. The pulse counter 42 sequentially counts pulses of the pulse train CP1″ and the counted content is supplied to an indicator 43, thereby providing a digital indication of the content of counting achieved by the counter 42. The indicator 43 is supplied with the output R4 from the flip-flop circuit 14 and designed to provide a digital indication of the content of the counter 42 with "–" when the output R4 is "0" and a digital indication with "+" when the output R4 is "1."

The foregoing has outlined the construction of one example of this invention and the following will describe its operation on the assumption that the analog input voltage $V_I$ from the analog input signal source 1 is negative and that the operation starts from he time $t_0$.

Since the rectangular wave R1 derived from the output terminal 19 of the timing signal generator circuit 17 is of the value "1" between $t_0$ and $t_{32}$ as shown in FIG. 2C, the contact *c* of the change-over switch 2 lies on the side of the contact *a* in this period. Accordingly, the input voltage $-V_I$ is integrated by the integrator circuit 3 from the time $t_0$ and the output voltage E (hereinafter referred to as $E_{32}$) derived at the output terminal 8 of the integrator circuit 3 at the time $t_{32}$ is given by the following equation.

$$+E_{32}=+\frac{1}{RC}\int_{t_0}^{t_{32}} V_1 dt \qquad (1)$$

where R is the value of the resistor 6 and C that of the capacitor 7.

Thus, the rectangular wave R1 becomes "0" at the time $t_{32}$, so that the contact $c$ of the change-over switch 2 is changed over to the side of the contact $b$ at the time $t_{32}$. While, the output Q from the comparator circuit 12 at the time $t_{32}$ has the value "1" because the input voltage to the comparator circuit 12 at that time is the output voltage $E_{32}$ from the integrator circuit 3 and becuase the voltage $E_{32}$ is positive, and the output Q is applied to the terminal $d$ of the flip-flop circuit 13. At the time $t_{32}$ the pulse of the pulse train P1 is derived at the output terminal 20 of the timing signal generator circuit 17 as depicted in FIG. 2D and is fed to the input terminal $e$ of the flip-flop circuit 13. Consequently, the flip-flop circuit 13 is set at the time $t_{32}$ and the output R3 derived from the output terminal $y$ becomes "1" at the time $t_{32}$, so that the contact $c$ of the change-over switch 11 is changed over to the side of the contact $a$.

Thus, the positive reference voltage $+V_P$ from the reference voltage source 10P is applied to the integrator 3 through the contacts $a$ and $c$ of the change-over switch 11 and those $b$ and $c$ of the change-over switch 2 from the time $t_{32}$ and the reference voltage $+V_P$ is thereby integrated. The output voltage E (hereinafter referred to as $E_{48}$) derives at the output terminal 8 of the integration circuit 3 at the time $t_{48}$ has a value given by the following equation.

$$E_{48}=+E_{32}-\frac{1}{RC}\int_{t_{32}}^{t_{48}} V_P dt \qquad (2)$$

In this case, the value of the voltage $+V_P$ is preselected such that the value $|-E_K|$ expressed by the following equation $$-E_K=-\frac{1}{RC}\int_{t_0}^{t_{32}} V_P dt \qquad (3)$$

may be less than a predetermined maximum value of the output $|+E_{32}|$ given by the Equation (1).

The compared output Q, which is "1" or "0" at the time $t_{48}$ dependent upon whether the value of the output $E_{48}$ at the time $t_{48}$ given by the Equation (2) is positive or zero or negative, is applied to the input terminal $d$ of the flip-flop circuit 13. While, the pulse of the pulse train P1 derived at the output terminal 20 of the timing signal generator circuit 17 at the time $t_{48}$, shown in FIG. 2D, is applied to the input terminal $e$ of the flip-flop circuit 13. Theefore, in the case where the compared Q is "1" at the time $t_{48}$, that is, where the value of the output $E_{48}$ is positive or zero at that time, the flip-flop circuit 13 having been held in its set state is not altered to the reset state but in the case where the compared output Q is "0," that is, where the value of the output $E_{48}$ is negative, the flip-flop circuit 13 held in the set state is altered to the reset state. Accordingly, in the event that the value of the output $E_{48}$ is positive or zero at the time $t_{48}$, the contact $c$ of the changeover switch 11 held on the side of the contact $a$ still remains as it is but, in the event of the output $E_{48}$ being negative, the contact $c$ of the switch 11 is changed over to the side of the contact $b$ at the time $t_{48}$.

Where the value of the output $E_{48}$ is positive at the time $t_{48}$, the reference $+V_P$ is continuously integrated by the integrator 3 from the time $t_{48}$ and the output voltage E (hereinafter referred to as $E_{56}$) derived at the output terminal 8 of the integration circuit 3 at the time $t_{56}$ has a value given by the following Equation (4a) and where the output $E_{48}$ is zero the first term of the Equation (4a) is "0," so that the output $E_{56}$ has a value given by the following Equation (4a').

$$E_{56}=+E_{48}-\frac{1}{RC}\int_{t_{48}}^{t_{56}} V_P dt \qquad (4a)$$

$$-E_{56}=-\frac{1}{RC}\int_{t_{48}}^{t_{56}} V_P dt \qquad (4a')$$

In the event that the value of the output $E_{48}$ is negative at the time $t_{48}$, the negative voltage $-V_N$ from the reference voltage source 10N is supplied to the integration circuit 3 through the contacts $b$ and $c$ of the change-over switch 11 and those $b$ and $c$ of the change-over switch 2 and is integrated from the time $t_{48}$. The output $E_{56}$ derived at the output terminal 8 of the integration circuit 3 at the time $t_{56}$ has a value given by the given equation.

$$E_{56}=-E_{48}+\frac{1}{RC}\int_{t_{48}}^{t_{56}} V_N dt \qquad (4b)$$

Similarly, if the value of the output $E_{56}$ at the time $t_{56}$ is positive or zero, the flip-flop circuit 13 is still held in its set state and, if negative, the flip-flop circuit 13 is altered to its reset state. After all, where the value of the output $E_{56}$ is positive or zero at the time $t_{56}$, an output $E_{60}$ derived at the output terminal 8 of the integration circuit 3 at the time $t_{60}$ has a value given by the following Equation (5$a$) or (5$a'$) and, if negative, the output $E_{60}$ has a value given by the following Equation (5$b$).

$$E_{60}=+E_{56}-\frac{1}{RC}\int_{t_{56}}^{t_{60}} V_P dt \qquad (5a)$$

$$-E_{60}=-\frac{1}{RC}\int_{t_{56}}^{t_{60}} V_P dt \qquad (5a')$$

$$E_{60}=-E_{56}+\frac{1}{RC}\int_{t_{56}}^{t_{60}} V_N dt \qquad (5b)$$

Likewise, in the case where the value of the output $E_{60}$ is positive or zero at the time $t_{60}$, an output $E_{62}$ derived at the output terminal 8 of the integration circuit 3 at the time $t_{62}$ has a value given by the following Equation (6*a*) or (6*a'*) and, if negative, the output $E_{60}$ has a value given by the following Equation (6*b*).

$$E_{62}=+E_{60}-\frac{1}{RC}\int_{t_{60}}^{t_{62}}V_P dt \qquad (6a)$$

$$-E_{62}=-\frac{1}{RC}\int_{t_{60}}^{t_{62}}V_P dt \qquad (6a')$$

$$E_{62}=-E_{60}+\frac{1}{RC}\int_{t_{60}}^{t_{62}}V_N dt \qquad (6b)$$

In the event that the value of the output $E_{62}$ is positive or zero at the time $t_{62}$, an output $E_{63}$ derived at the output terminal 8 of the integration circuit 3 at the time $t_{63}$ has a value given by the following Equation (7*a*) or (7*a'*) and if negative, the output $E_{62}$ has a value given by the following Equation (7*b*).

$$E_{63}=+E_{62}-\frac{1}{RC}\int_{t_{62}}^{t_{63}}V_P dt \qquad (7a)$$

$$-E_{63}=-\frac{1}{RC}\int_{t_{62}}^{t_{63}}V_P dt \qquad (7a')$$

$$E_{63}=+E_{62}-\frac{1}{RC}\int_{t_{62}}^{t_{63}}V_N dt \qquad (7b)$$

Thus, at the time $t_{63}$, the reset pulse P4 which has the value "1" from the time $t_{63}$ to $t_{64}$ is derived at the output terminal 24 of th timing signal generator circuit 17, so that the reset switch 9 is closed from the time $t_{63}$ to $t_{64}$ and the value of the output E derived at the output terminal 8 of the integration circuit 3 from a time a little past $t_{63}$ to $t_{64}$. Consequently, the output E (hereinafter referred to as $E_{64}$) at the time $t_{64}$ is "0."

The times $t_{64}$, $t_{96}$, $t_{112}$, $t_{120}$, $t_{124}$, $t_{126}$, $t_{127}$ and $t_{128}$; $t_{128}$, $t_{160}$, $t_{176}$, $t_{184}$, $t_{188}$, $t_{190}$, $t_{191}$ and $t_{192}$; . . . correspond to those $t_0$, $t_{32}$, $t_{48}$, $t_{56}$, $t_{60}$, $t_{62}$, $t_{63}$ and $_{64}$ respectively, at which the same operations as those above described are achieved.

By the way, the rectangular wave R2, which has the value "1" from the time $t_{48}$ to $t_{64}$, from $t_{112}$ to $t_{128}$, . . . as depicted in FIG. 2E, is applied to the input line **36*a* of the "and" gate circuit 35 to derive therefrom a pulse train CP1' such as shown in FIG. 21 from the time $t_{48}$ to $t_{64}$, from $t_{112}$ to $t_{128}$, . . . , which is fed to the input line 38*b* of the "and" gate circuit 37. While, the rectangular wave R3** derived at the output terminal *y* of the flip-flop circuit 13 has the value "1" while the circuit 13 is in the set state and has the value "0" while the circuit 13 is in the reset state. Such a rectangular wave R3 is supplied to the input line **38*a* of the "and" gate circuit 37. Since the compared output Q has the value "1" at the time $t_{32}$ as above described, the flip-flop circuit 14 is set by the pulse P2 at the time $t_{32}$, and accordingly the output R4** derived at its output terminal *n* always has the value "0" after the time $t_{32}$, thereby holding the movable contact *c* of the change-over switch 39 on the side of the contact *a*.

Accordingly, in the periods during which the rectangular wave R3 has the value "1" between the times $t_{48}$ and $t_{64}$, between $t_{112}$ and $t_{128}$, . . . , the pulse train CP1' is applied to the "and" gate circuit 37 to provide a pulse train CP1'', which is supplied to the counter 42. In this case, the counter 42 is set in advance at the times $t_{47}$, $t_{111}$, . . . prior to $t_{48}$, $t_{112}$, . . . .

Consequently, the counter 42 counts the number of pulses of the pulse train CP1'' derived from the "and" gate circuit 37 between the times $t_0$ and $t_{64}$, between $t_{64}$ and $t_{128}$, . . . and the number of the pulses counted is indicated in the digital form on the indicator 43 from the times $t_{64}$, $t_{128}$, . . . until the counter 42 is reset by the pulses P3 obtained at the times $t_{111}$, $t_{175}$, . . . , respectively. The number of the pulses counted by the counter 42 is obtained as a value proportional to the integrated output $|+E_{32}|$. Further, in this case, since the output R4 is fed to the indicator 43, the indicator 43 also provides the indication "—." This will become apparent from the following concrete example.

Namely, let it be assumed for the sake of brevity that the input voltage $-V_I$ is a constant voltage and that the integrated output $|-E_K|$ expressed by the Equation (3) is equal to a maximum value of the output $|+E_{32}|$ expressed by the Equation (1).

In such a case, from the Equations (1) and (3) the following relationship can be obtained:

$$\left|\frac{1}{RC}\int_{t_0}^{t_{32}}V_I dt\right|=\left|-\frac{1}{RC}\int_{t_0}^{t_{32}}V_P dt\right|$$

$$|-V_I|=|+V_P| \qquad (8)$$

Therefore, the output E from the integration circuit 3 linearly increases in a positive direction with a gradient corresponding to the values of R and C from the time $t_0$ and reaches a point $X_{10}$ at which the output $+E_{32}$ (hereinafter referred to as $+E_{32\text{-}1}$) based on the Equation (1) at the time $t_{32}$ is produced, as indicated by a line $U1_0$ in FIG. 2J. Since the output $+E_{32\text{-}1}$ is positive in this case, the compared output Q has the value "1" as shown in FIG. $2K_1$. Consequently,, the flip-flop circuit 13 is set based on the pulse of the pulse train P1 at the time $t_{32}$ and the rectangular wave R3 derived at the output terminal *y* of the flip-flop circuit 13 comes to have the value "1" from the time $t_{32}$ as shown in FIG. $2L_1$, so that the reference voltage $+V_P$ becomes integrated by the integration circuit 3 from the time $t_{32}$. If this integration proceeds to the time $t_{64}$, the time interval between the times $t_0$ and $t_{32}$ and that $(T_1+T_2+T_3+T_4+T_5+T_6)$ ($T_6$ being the time between $t_{63}$ and $t_{64}$ and bearing a relationship $T_6=T_5$) between $t_{32}$ and $t_{64}$ are equal to each other. Accordingly, the integrated output E linearly decreases from the position of the point $X1_0$ at the time $t_{32}$ with a gradient reverse to the line $U1_0$ and reaches a point $X1_6$ at the time $t_{64}$ when the output E has the value "0." Therefore, as indicated by a line $U1_1$ in FIG. 2J, the integrated output E decreases along a straight line joining the point $X1_0$ with that $X1_6$ and reaches a point $X1_1$ at the time $t_{48}$ at which the output $E_{48}$ (hereinafter referred to as $E_{48\text{-}1}$) based on the Equation (2) is produced. In this case, the output $E_{48\text{-}1}$ is positive and the compared output Q has the value "1," so that the flip-flop circuit 13 is held in the set state. Accordingly, the change-over switch 11 is not changed over and the integrated output E continues to decrease similarly along a straight line joining the point $X1_0$ with that $X1_6$ from the time $t_{48}$ as indicated by a line $U1_2$ and reaches a point $X1_2$ at the time $t_{56}$ at which the output (hereinafter referred to as $E_{56\text{-}1}$ based on the the Equation (4*a*) is produced. Also in this case, the output $E_{56\text{-}1}$ is positive, so that the integrated output E similarly continues to decrease from the position of the point $X1_2$ at the time $t_{56}$ down to a point $X1_3$ at the time $t_{60}$ at which the output $E_{60}$ (hereinafter referred to $E_{60\text{-}1}$) based on the Equation (5*a*) is produced, as indicated by a line $U1_3$. Thereafter, the integrated output E likewise decreases from the time $t_{60}$ down to a point $X1_4$ at the time $t_{62}$ at which the output $E_{62}$ (hereinafter referred to as $E_{62\text{-}1}$) based on the Equation (6*a*) is obtained, as indicated by a line $U1_4$. Then, the integrated output E still continues to decrease down to a point $X1_5$ at the time $t_{63}$ at which the output $E_{63}$ (hereinafter referred to as $E_{63\text{-}1}$) based on the Equation (7*a*) is obtained, as indicated by a line $U1_5$. Thereafter, the reset switch 9 of the integration circuit 3 is closed between the time $t_{63}$ and $t_{64}$, so that the output E from the integration circuit 3 has the value "0" until the time $t_{64}$ a little past $t_{63}$ as shown by a line $U1_6$. In this case, the output R3 from the flip-flop circuit 13 has the value "1" for the entire period during which the rectangular wave R2 derived at the output terminal 21 of the timing signal generator circuit 17 has the value "1," as illustrated in FIG. $2L_1$. While, the flip-flop circuit 14 is set by the pulse P2 at the time $t_{32}$, so that the output R4 derived from its output terminal *n* comes to have the value "0" from the time $t_{32}$ as illustrated in FIG. $2N_1$.

Accordingly,, the pulse CP1 derived from the clock pulse train CP-' passes through the "and" gate circuit 37 for the entire period during which the rectangular wave R2 has the value "1," that is, for the period between the time $t_{48}$ and $t_{64}$ which is half as long as that between the times $t_{32}$ and $t_{64}$, as shown in FIG. $2M_1$ and the pulse CP1'' is applied to the counter 42. Thus, the counter 42 counts 16 pulses in the period from the time $t_0$ to $t_{64}$ and, based on the content counted, the indicator 43 indicates that the input voltage $V_I$ is, for example, "−16V" until the counter 42 is subsequently reset. Thereafter, the counter 42 similarly counts 16 pulses in the periods between the times $t_{64}$ and $t_{128}$, between $t_{128}$ and $t_{192}$, . . . and the indicator 43 indicates that the input voltage $V_I$ is "−16V." The indication "−16V" by the indicator 43 implies that the input voltage $V_I$ is negative "16V" and is a maximum value of the input voltage $V_I$.

Assuming that the input voltage $|V_I|$ is half as low as that in the foregoing example, that is, the following relationship exists:

$$\left|\frac{1}{RC}\int_{t_0}^{t_{32}} V_I dt\right| = \left|-\frac{1}{2}\cdot\frac{1}{RC}\int_{t_0}^{t_{32}} V_P dt\right|$$

$$|-V_I| = \left|\frac{1}{2}\cdot V_P\right| \qquad (9)$$

the output E from the integration circuit 3 linearly increases with a gradient half as small as that of the aforementioned line $U1_0$ and reaches a point $X2_0$ at the time $t_{32}$ at which the output $+E_{32}$ (hereinafter referred to as $+E_{32\text{-}2}$) based on the Equation (1) is obtained, as indicated by a line $U2_0$ in FIG. 2J. In this case, the output $+E_{32\text{-}2}$ is positive, so that the compared output Q has the value "1" as shown in FIG. $2K_2$. Consequently, the flip-flop circuit 13 is set based on the pulse of the pulse train P1 at the time $t_{32}$ and the rectangular wave R3 derived at the output terminal *y* of the flip-flop circuit 13 comes to have the value "1" from the time $t_{32}$ as shown in FIG. $2L_2$, so that the reference voltage $+V_P$ becomes integrated by the integration circuit 3 from the time $t_{32}$. If this integration continues until the time $t_{64}$, the reference voltage $+V_P$ is the same as that in the case of the aforementioned line joining the points $X1_0$ and $X1_6$, with the result that the integrated output E decreases from the position of the point $X2_0$ at the time $t_{32}$ with the same gradient as that of the line $U1_1$ and reaches a point $X2_6$ at the time $t_{64}$ at which the output E is negative and equal to the output $|+E_{32\text{-}2}|$. Accordingly, the integrated output E decreases from the time $t_{32}$ along a straight line joining the points $X2_0$ and $X2_6$ and reaches a point $X2_1$ at the time $t_{48}$ at which the output $E_{48}$ (hereinafter referred to as $E_{48\text{-}2}$)based on the Equation (2) is produced, as indicated by a line $U2_1$. The point $X2_1$ herein mentioned is a point at which the output E has the value "0" because the time between $t_{32}$ and $t_{48}$ and that between $t_{48}$ and $t_{64}$ are equal to each other. Therefore, the output Q has the value "1" at the time $t_{48}$, so that the flip-flop circuit 13 remains in the set state and accordingly the change-over switch 11 is not changed over. The integrated output E continues to decrease from the time $t_{48}$ down to a point $X2_2$ at the time $t_{56}$ at which the output $E_{56}$ (hereinafter referred to as $E_{56\text{-}2}$) based on the Equation (4*a'*) is obtained, as indicated by a line $U2_2$. Since the output $E_{56\text{-}2}$ is negative in this case, the flip-flop circuit 13 is reset by the pulse of the pulse train P1 at the time $t_{56}$ to provide the output R3 having the value "0." Accordingly, the contact *c* of the change-over switch 11 is changed over to the side of the contact *b*, causing the integration circuit 3 to integrate the negative reference voltage $-V_N$ from the time $t_{56}$. As a result of this, the integrated output E increases in a positive direction from the point $X2_2$ of the time $t_{56}$ as indicated by a line $U2_3$. Since $|+V_P| = |-V_N|$ in this case, the line $U2_3$ extends from the position of the point $X2_2$ with a gradient reverse to that of the aforesaid line $U1_3$ toward the point $X2_6$ (the same point as that $X1_6$) at which the integrated output E has the value "0" at the time $t_{64}$ and reaches a point $X2_3$ at the time $t_{60}$ at which the output $E_{60}$ (hereinafter referred to as $E_{60\text{-}2}$)based on the Equation (5*b*) is obtained. In this case, the output $E_{60\text{-}2}$ is negative and the compared output Q has the value "0," so that the flip-flop circuit 13 remains in the reset state, and consequently the change-over switch 11 is not changed over. Accordingly, the integrated output E continues to increase in the positive direction from the position of the point $X2_3$ at the time $t_{60}$ and reaches a point $X2_4$ at the time $t_{62}$ at which the output $E_{62}$ (hereinafter referred to $E_{62\text{-}2}$) based on the Equation (6*b*) is obtained. Also in this case, the output $E_{62\text{-}2}$ is positive, so that the integrated output E similarly continues to increase in the positive direction from the position of the point $X2_4$ at the time $t_{62}$ as shown by a line $U2_5$ and reaches a point $X2_5$ at the time $t_{63}$ at which the output $E_{63}$ (hereinafter referred to as $E_{63\text{-}2}$) based on the Equation (7*b*) is obtained. Thereafter, the reset switch 9 is closed between the times $t_{63}$ and $t_{64}$, with the result that the output E from the integration circuit 3 is zero from a time a little past $t_{63}$ to the time $t_{64}$ as shown by a line $U2_6$. In this case, the output R3 from the flip-flop circuit 13 has the value "0" after the time $t_{56}$ as illustrated in FIG. $2L_2$. While, the output R4 from the flip-flop circuit 14 has the value "0" after the time $t_{32}$ in the same manner as that previously described, as depicted in FIG. $2N_2$. Consequently, the pulse train CP1'' is derived from the "and" gate circuit 37 only between the times $t_{48}$ and $t_{56}$ as shown in FIG. $2M_2$ and is applied to the counter 42. In this case, the time between $t_{48}$ and $t_{56}$ is half as long as that between $t_{48}$ and $t_{64}$, so that the counter 42 counts eight pulses and the indicator 43 indicates it. In this case, the indicator provides an indication that the input voltage $V_I$ is "−8V" because "−16V" is indicated in the case where the counter 42 counts 16 pulses as previously described. Thereafter, the counter 42 similarly counts eight pulses in the periods between $t_{64}$ and $t_{128}$, between $t_{128}$ and $t_{192}$, . . . respectively and the indicator 43 thus indicates that the input voltage $V_I$ is "−8V." The present example has been described on the assumption that the value of the input voltage $V_I$ is half as much as that in the above case in which "−16V" is indicated, that is, the relationship expressed by the Equation (9) is adopted. Accordingly, the indication of "−8V" implies that the input voltage $V_I$ is accurately indicated.

Further, if the input voltage $V_I$ is zero, the output E from the integration circuit 3 is zero between the times $t_0$ and $t_{32}$ as indicated by $U3_0$ in FIG. 2J. However, the compared output Q has he value "1" at the time $t_{32}$ as depicted in FIG. $2K_3$, so that the output R3 from the flip-flop circuit 13 comes to have the value "1" from the time $t_{32}$. As a result of this, the reference voltage $+V_P$ is integrated by the integration circuit 3 from the time $t_{32}$, and accordingly if this integration is carried out until the time $t_{64}$, the integrated output E decreases with the same gradient as that of the line $U2_1$ from the position of the point $X3_0$ of the output E being zero at the time $t_{32}$ as in the above case and reaches a point $X3_6'$ at the time $t_{64}$ at which the output E has a value equal to the negative output $|+E_{32\text{-}1}|$. Accordingly, the integrated output E decreases from the time $t_{32}$ along a line joining the points $X3_0$ and $X3_6'$ (increases in the negative direction) as indicated by a line $U3_1$ and reaches a point $X3_1$ at the time $t_{48}$ at which the output $E_{48}$ (hereinafter referred to as $E_{48\text{-}3}$) based on the Equation (2) (the first term being zero) is obtained. In this case, the value of the output $E_{48}$ is negative and equal to that of the aforesaid output $|+E_{32\text{-}2}|$, so that the compared output Q has the value "0" at the time $t_{48}$ and the flip-flop circuit 13 is reset at the time $t_{48}$ and the output R3 therefrom has the value "0." Therefore, the change-over switch 11 is changed over to cause the integration circuit 3 to integrate the reference voltage $-V_N$. As a result of this, the integrated output E increases from the point $X3_1$ in the positive direction to reach a position $X3_2$ (the same position as the point $X2_2$) at the time $t_{56}$ at which the output $E_{56}$ (hereinafter referred to as $E_{56\text{-}3}$) based on the Equation (4*b*) is obtained, as indicated by a line $U3_2$. In this case, the output $E_{56\text{-}3}$ is negative, so that the output R3 from the flip-flop circuit 13 still has the value "0." Accordingly, the integrated output E increases from the point $X3_2$ along a line $U3_3$ (the same as the line $U2_3$) to reach a point $X3_3$ (the same as that $X2_3$), then still increases from the point $X3_3$ along a line $U3_4$ (the same as that $U2_4$) to a point $X3_4$ (the same as that $X2_4$) and further increases from the point $X3_4$ along a line $U3_5$ (the same as that $U2_5$) to a point $X3_5$ (the same as that $X2_5$). Thereafter, the reset switch 9 is closed between the times $t_{63}$ and $t_{64}$, so that the output E from the integration circuit 3 is zero from a time a little past $t_{63}$ to the time $t_{64}$ as indicated by a line $U3_6$. In this case, the output R3 from the flip-flop circuit 13 has the value "1" only between the times $t_{32}$ and $t_{48}$ as shown in FIG. $2K_3$. While, even if the output R4 from the flip-flop circuit 14 has the value "0" after the time $t_{32}$ in the same manner as previously described as illustrated in FIG. $2N_3$, the clock pulse train CP1' is applied to the "and" gate circuit 37 only between the times $t_{48}$ and $t_{64}$, so that the clock pulse CP1'' is not derived from the "and" gate circuit 37 as depicted in FIG. $2M_3$. Consequently, the counter 42 does not count any pulse between the times $t_0$ and $t_{64}$ and the indicator 43 provides an indication that the input voltage $V_I$ is "0." Thereafter, the counter 42 similarly does not count any pulse between the times $t_{64}$ and $t_{128}$, between $t_{128}$ and $t_{192}$, . . . , so that the indicator 43 provides an indication that the input voltage $V_I$ is "OV." Since the input voltage $V_I$ is zero in the present example, this implies that an accurate indication of the input voltage $V_I$ can be obtained.

A description will be given, though not in detail, in connection with the case where the input voltage $V_I$ is a constant negative voltage and is five-eighths times that in the case where the digital value of "−16V" is indicated by the indicator 43, that is, the following relationship is adopted.

$$|-V_I| = |5/8 \cdot V_P| \tag{10}$$

The integrated output E from the integrator circuit 3 increases in the positive direction from the time $t_0$ to reach a point $X4_0$ at the time $t_{32}$ at which the output E has a value five-eighths times that of the aforesaid output $E_{32\text{-}1}$, that is, a value $5/8 \cdot E_{32\text{-}1}$ (hereinafter referred to as $E_{32\text{-}4}$), as shown by a line $U4_0$. From the point $X4_0$ the integrated output E decreases down to a point $X4_1$ at the time $t_{48}$ at which a value $E_{48\text{-}4}$ of a positive output $|E_{48\text{-}1} - (E_{32\text{-}1} - E_{32\text{-}4})|$ based upon the Equation (2) is obtained, as indicated by a line $U4_1$. The integrated output E further decreases from the point $X4_1$ and becomes negative and reaches a point $X4_2$ at the time $t_{56}$ at which a value $-E_{56\text{-}4}$ of a negative output $|E_{56\text{-}1} - (E_{32\text{-}1} - E_{32\text{-}4})|$ based on the Equation (4*a*) is obtained, as indicated by a line $U4_2$, and, further, the integrated output E increases from the point $X4_2$ in the positive direction to reach a point $X4_3$ at the time $t_{60}$ at which the output E has the value "0" based on the Equation (5*b*), as shown by a line $U4_3$, and from thence the output E increases in the negative direction to a point $X4_4$ at the time $t_{62}$ at which it has a value $-E_{62\text{-}4}$ equal to a negative output $|+E_{62-1}|$ based on the Equation (6*a'*), as indicated by a line $U4_4$, and from thence the output E further increases in the positive direction to a point $X4_5$ at the time $t_{63}$ at which it has a value $-E_{63-4}$ equal to a negative output $|+E_{63-1}|$, as indicated by a line $U4_5$, and, the integrated output E has the value "0" from a time a little past $t_{63}$ to the time $t_{64}$. In this case, the compared output Q, the output R3 from the flip-flop circuit 13, the pulse train CP1'' from the "and" gate circuit 37 and the output R4 from the flip-flop circuit 14 are obtained as illustrated in FIGS. $2K_4$, $2L_4$, $2M_4$ and $2N_4$, respectively. Accordingly, the counter 42 counts 10 pulses in all between the times $t_0$ and $t_{64}$ and the indicator 43 indicates that the input voltage $V_I$ is "−10V." Also between the times $t_{64}$ and $t_{128}$, between $t_{128}$ and $t_{192}$, . . . the indicator 43 similarly provides the indication of "−10V." This implies that an accurate indication of the input voltage $V_I$ is obtained, because $-16 \times 5/8 = -10$ based on the relationship of the Equation (10). Also in the event that the input voltage $V_I$ is negative and has a value other than that in the foregoing, a digital indication is similarly provided corresponding to the value of the input voltage $V_I$. After all, in the above example, an analog-to-digital conversion characteristic expressed by the following function.

$$|V_I| = N \tag{11}$$

is obtained as shown in FIG. 3 in which the ordinate represents the value of the input voltage $|V_I|$ and the abscissa the value of the counting number N of the counter 42.

A brief description will be made in connection with the case where the input voltage $V_I$ has a certain positive value and the operation similarly starts from the time $t_0$.

In the same manner as that previously described the input voltage $+V_I$ is integrated by the integration circuit 3 from the time $t_0$ and at the time $t_{32}$ the integrated output E is obtained with a value $-E_{32}$ given by the following equation corresponding to the aforesaid Equation (1).

$$-E_{32} = -\frac{1}{RC}\int_{t_0}^{t_{32}} V_I dt \tag{12}$$

Further, the contact c of the change-over switch 2 is changed over to the side of the contact b from the time $t_{32}$. While, the compared output Q has the value "0" at the time $t_{32}$ because the output $-E_{32}$ is negative, so that the output R3 from the flip-flop circuit 13 does not become "1" but remains "0" at the time $t_{32}$ and the change-over switch 11 is not changed over. As a result of this, the integration circuit 3 comes to integrate the negative reference voltage $-V_N$ from the reference voltage source 10N from the time $t_{32}$ to produce the integrated output E having a value $E_{48}$ given by the following equation at the time $t_{48}$.

$$E_{48} = -E_{32} + \frac{1}{RC}\int_{t_{32}}^{t_{48}} V_N dt \tag{13}$$

In this case, the value of the voltage $-V_N$ is selected such that the value of an integrated output $|E_K'|$ expressed by the following equation:

$$+E_K' = +\frac{1}{RC}\int_{t_0}^{t_{32}} V_N dt \tag{14}$$

as is the case with the Equation (3) may be less than a predetermined maximum value of the output $|-E_{32}|$ given by the Equation (12') and such that $|-E_K| = |+E_K'|$ because the voltage $-V_N$ bears a relationship $|+V_P| = |-V_N|$.

If the output $E_{48}$ at the time $t_{48}$ given by the Equation (13) is positive or zero, the compared output Q has a value "1" at the time $t_{48}$ and if negative, it has the value "0." Thereafter, in the manner above describes in the case where the input voltage $V_I$ is negative, if the output $E_{48}$ at the time $t_{48}$ given by the Equation (13) is positive or zero, the integrated output E is obtained as an output $E_{56}$ given by the following Equation (15a) or (15a') and if negative, it is obtained as an output $E_{56}$ given by the following Equation (15b).

$$E_{56} = +E_{48} - \frac{1}{RC}\int_{t_{48}}^{t_{56}} V_P dt \tag{15a}$$

$$-E_{56} = -\frac{1}{RC}\int_{t_{48}}^{t_{56}} V_P dt \tag{15a'}$$

$$E_{56} = -E_{48} + \frac{1}{RC}\int_{t_{48}}^{t_{56}} V_N dt \tag{15b}$$

Similarly, if the output $E_{56}$ at the time $t_{56}$ expressed by the Equation (15a) or (15b) is positive or zero, the integrated output E at the time $t_{60}$ is obtained as an output $E_{60}$ given by the following equation (16a) or (16a') and if the former is negative or the output $-E_{56}$ expressed by the Equation (15a'), the latter is obtained as an output $E_{60}$ given by the following Equation (16b).

$$E_{60} = +E_{56} - \frac{1}{RC}\int_{t_{56}}^{t_{60}} V_P dt \tag{16a}$$

$$-E_{60} = -\frac{1}{RC}\int_{t_{56}}^{t_{60}} V_P dt \tag{16a'}$$

$$E_{60} = -E_{56} + \frac{1}{RC}\int_{t_{56}}^{t_{60}} V_N dt \tag{16b}$$

Further, the integrated output E at the time $t_{62}$ is similarly obtained as an output $E_{62}$ given by the following Equation (17a) or (17a') when the output $E_{60}$ at the time $t_{60}$ expressed by the Equation (16a) or (16b) is positive or zero and given by the following Equation (17b) when the output $E_{60}$ is negative or the output $-E_{56}$ expressed by the Equation (16a'). Likewise, the integrated output E at the time $t_{63}$ is obtained as an output $E_{63}$ given by the following Equation (18a) or (18a') when the output $E_{62}$ at the time $t_{62}$ is positive or zero and given by the following Equation (18b) when the output $E_{62}$ is negative, and, further, the integrated output E is made zero from a time a little past the time $t_{63}$ to the time $t_{64}$.

$$E_{62} = E_{60} - \frac{1}{RC}\int_{t_{60}}^{t_{62}} V_P dt \tag{17a}$$

$$-E_{62} = -\frac{1}{RC}\int_{t_{60}}^{t_{62}} V_P dt \tag{17a'}$$

$$E_{62} = -E_{60} + \frac{1}{RC}\int_{t_{60}}^{t_{62}} V_N dt \quad (17b)$$

$$E_{63} = E_{62} - \frac{1}{RC}\int_{t_{62}}^{t_{63}} V_P dt \quad (18a)$$

$$-E_{63} = -\frac{1}{RC}\int_{t_{62}}^{t_{63}} V_P dt \quad (18a')$$

$$E_{63} = -E_{62} + \frac{1}{RC}\int_{t_{62}}^{t_{63}} V_N dt \quad (18b)$$

Then, the times $t_{64}$, $t_{96}$, $t_{112}$, $t_{120}$, $t_{124}$, $t_{126}$, $t_{127}$ and $t_{128}$; $t_{128}$, $t_{160}$, $t_{176}$, $t_{188}$, $t_{190}$, $t_{191}$ and $t_{192}$; . . . correspond to those $t_0$, $t_{32}$, $t_{48}$, $t_{56}$, $t_{60}$, $t_{62}$, $t_{63}$ and $t_{64}$ respectively as previously described and the same operations as above described are achieved.

Also in this example, the pulse trains CP1′ and CP1″ are derived from the "and" gate circuits 35 and 37, respectively in the same manner as in the case of the input voltage $V_I$ being negative and the pulses of the pulse train CP1″ are counted by the counter 42 and the number of the pulses thereby counted is indicated by the indicator 43 until resetting of the counter 42 in the same manner as in the case of the input voltage $V_I$ being negative. The number of pulses counted by the counter 42 is obtained as a value proportional to the integrated output $|-E_{32}|$ given by the Equation (12). Although not described in detail, this will becomes more apparent from the following concrete example.

For the sake of brevity, let it be assumed that the input voltage $V_I$ is a certain positive voltage and that the output $|+E_K'|$ expressed by the Equation (14) is equal to a maximum value of the output $|E_{32}|$ by the Equation (12). The integrated output E increases in the negative direction from the time $t_0$ reaches a point $X5_0$ at the time $t_{32}$ at which it has a negative value $-E_{32\text{-}5}$ equal to $|E_{32\text{-}1}|$ based on the Equation (12), as shown by a line $U5_0$, from thence the output E increases in the positive direction to reach a point $X5_1$ at the time $t_{48}$ at which it has a value $-E_{48\text{-}5}$ half times smaller than that of the output $-E_{32\text{-}5}$ based on the Equation (13), as indicated by a line $U5_1$, from thence the output E increases in the positive direction to reach a point $X5_2$ at the time $t_{56}$ at which it has a value $-E_{56\text{-}5}$ half times smaller than that of the output $|-E_{48\text{-}5}|$ based on the Equation (15*b*), as indicated by a line $U5_2$, from thence the output E increases in the positive direction to reach a point $X5_3$ at the time $t_{60}$ at which it has a value $-E_{60\text{-}5}$ half times smaller than that of the output $|-E_{56\text{-}5}|$ based on the Equation (16*b*), as indicated by a line $U5_3$, from thence the output E increases in the positive direction to reach a point $X5_4$ at the time $t_{62}$ at which it has a value $-E_{62\text{-}5}$ half times smaller than that of the output $|-E_{60\text{-}5}|$ based on the Equation (17*b*), as indicated by a line $U5_4$, and from thence the output E further increases in the positive direction to reach a point $X5_5$ at the time $t_{63}$ at which it has a value $-E_{63\text{-}5}$ half times smaller than that of the output $-E_{62\text{-}5}$ based on the Equation (18*b*), as indicated by a line $U5_5$, and the output E has the value "0" from a time a little past the time $t_{63}$ to the time $t_{64}$. In this case, the compared output Q, the output R3 from the flip-flop circuit 13, the output R3′ from the inverter circuit 41 and the pulse train CP1″ from the "and " gate circuit 37 are obtained as illustrated in FIGS. $2K_5$, $2L_5$, $2O_5$ and $2M_5$, respectively.

Consequently, the counter 42 counts sixteen pulses in all between the times $t_0$ and $t_{64}$ and the indicator 43 indicates "16V." Since the output R4 for this indication is always "1," a sign "+" is added to the indication "16V" and "+16V" is indicated by the indicator 43. Also between the times $t_{64}$ and $t_{128}$, between $t_{128}$ and $t_{192}$ the indication "+16V" is similarly provided by the indicator 43. In the example, the input voltage $V_I$ has a value equal to the absolute value $|V_I|$ of the voltage $V_I$ in the case of "–16V" being indicated by the indicator 43 but is positive in polarity. Accordingly, the indication "+16V" implies that the voltage Voltage $V_I$ is accurately indicated.

Assuming that the input voltage $V_I$ is a certain positive voltage and that the output voltage $|-E_{32}|$ expressed by the Equation (12) is five-eighths times that in the above example, the integrated output E increases in the negative direction from the time $t_0$ and reaches a point $X6_0$ at the time $t_{32}$ at which it has a value $-E_{32\text{-}6}$ five-eighths times smaller than the aforesaid negative output $-E_{32\text{-}5}$ based on the Equation (12), as indicated by a line $U6_0$, from thence the output E increases in the positive direction to reach a point $X6_1$ at the time $t_{48}$ at which it has a value $-E_{48\text{-}6}$ of the output $-\{|E_{48\text{-}5}| - (|E_{32\text{-}5}| - |-E_{32\text{-}6}|)\}$ based on the Equation (13), as indicated by a line $U6_1$, from thence the output E increases in the positive direction to become positive and reach a point $X4_2$ at the time $t_{56}$ at which it has a value $+E_{56\text{-}4}$ of the positive output $\{|-E_{56\text{-}5}| - (|-E_{32\text{-}5}| - |-E_{32\text{-}6}|)\}$ based on the Equation (15*b*), as indicated by a line $U6_2$, from thence the output E increases in the negative direction to reach a point $X6_3$ at the time $t_{60}$ at which it has the value "0" based on the Equation (16*a*), as indicated by a line $U6_3$, from thence the output E increases in the negative direction to reach a point $X4_4$ at the time $t_{62}$ at which it has a value $-E_{62\text{-}6}$ equal to that of the negative output $|-E_{62\text{-}1}|$ based on the Equation (17*a*′), as indicated by a line $U6_4$, and from thence the output E increases in the positive direction to reach a point $X6_5$ at the time $t_{65}$ at which it has a value $|-E_{63\text{-}6}|$ equal to that of the negative output $|-E_{63\text{-}1}|$ based on the Equation (18*b*), as indicated by a line $U6_5$, and the output E is made zero from a time a little past $t_{63}$ to the time $t_{64}$. In this case, the compared output Q, the outputs R3 and R4 from the flip-flop circuits 13 and 14, the output R3′ and the pulse train CP1″ are obtained as illustrated in FIGS. $2K_6$, $2L_6$ and $2N_6$, $2O_6$ and $2M_6$, respectively.

Accordingly, the pulse counter 42 counts ten pulses in all between the times $t_0$ and $t_{64}$ and the indicator 43 indicates that the input voltage $V_I$ is "10V." Further, the indicator 43 indicates that it is "+" and accordingly it provides an indication "+10V." Also between the times $t_{64}$ and $t_{128}$, between $t_{128}$ and $t_{192}$, . . . the indication "+10V" is similarly provided by the indicator 43. In the present example, the voltage $|-E_{32}|$ is five-eighths times that in the case where the indication "16V" is obtained, so that $+16 \times 5/8 = +10$ and the indication "+10V" implies that the input voltage $V_I$ is accurately indicated. Also in the case where the input voltage $V_I$ is positive and has a value other than that in the foregoing, a digital indication can be likewise obtained corresponding to the value of the input voltage $V_I$ and, after all, an analog-to-digital conversion characteristic I shown in FIG. 3 is obtained.

The foregoing has been described to obtain the analog-to-digital characteristic expressed by the Equation (11) or shown in FIG. 3. It will be seen from the foregoing that if the values of the reference voltages $|+V_P|$ and $|-V_N|$ are increased by $\alpha$ times or the time $T_C$ for integration of the input voltage $V_I$ is increased by $\alpha$ times ($\alpha$ being a desired positive number), an analog-to-digital conversion characteristic expressed by the Equation (19) can be obtained.

$$|V_I| = \alpha \cdot N \qquad (19)$$

Figure 4:
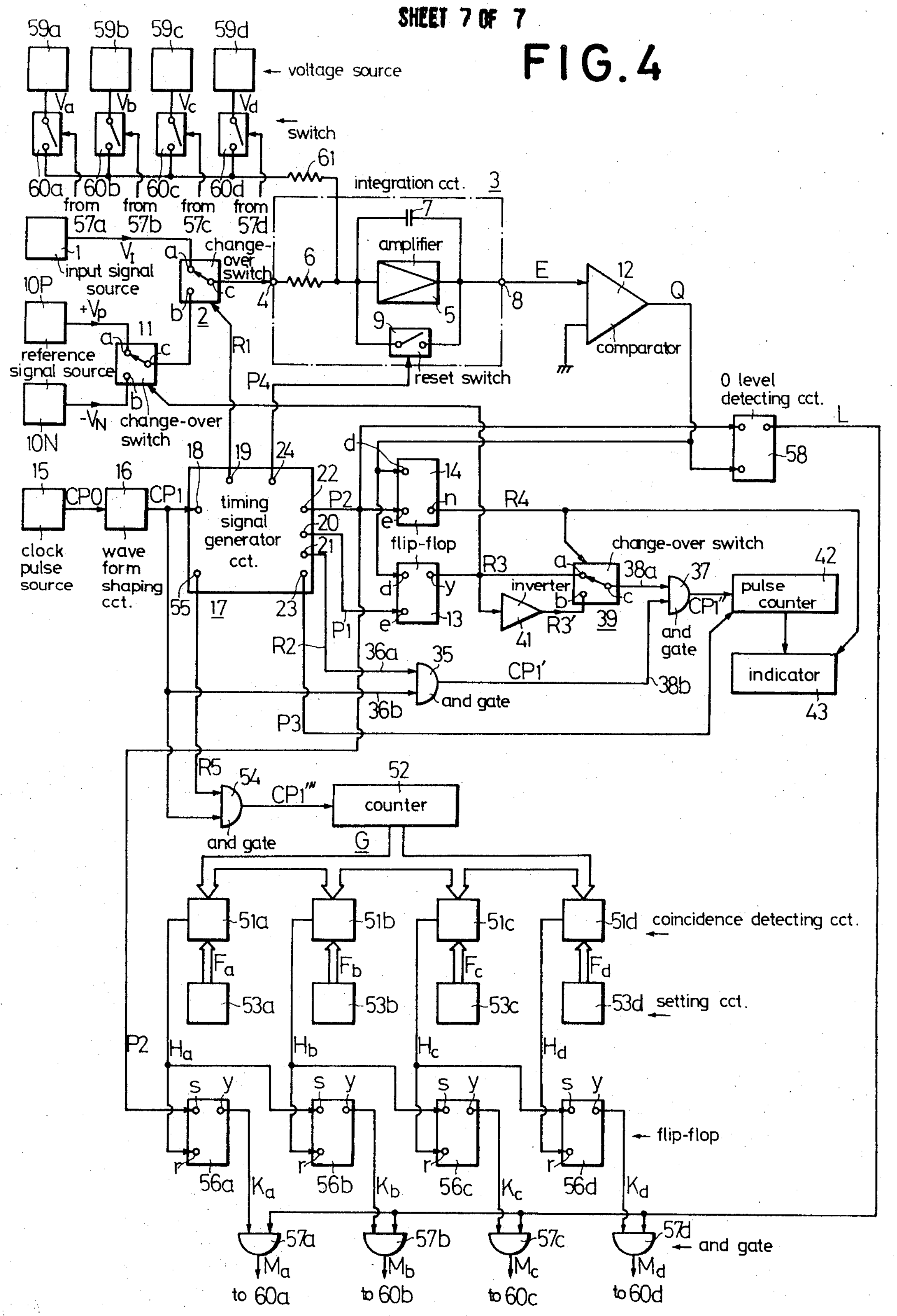
FIG. 4 is a block diagram illustrating a modified form of the integrating analog-to-digital converter according to this invention.

Referring now to FIG. 4, another example of this invention will hereinbelow be described in detail.

In the present example elements corresponding to those in FIG. 1 are identified by the same reference numerals and characters and no detailed description will be repeated therefor. The present example has the following construction in addition to that of FIG. 1.

Namely, for example, four coincidence detecting circuits 51a to 51d are provided, which are adapted to be supplied with a counted output G from a counter 52 and setting outputs $F_a$ to $F_d$ representative of digital values from setting circuits 53a to 53d, respectively. In this case, the counter 52 is constructed to count a clock pulse train CP1'' produced by supplying the clock pulse train CP1 from the waveform shaping circuit 16 to an "and" gate circuit 54. While, the aforesaid timing signal generator circuit 17 has another terminal 55 in addition to the aforementioned ones, from which is derived a rectangular wave R5 such as depicted in FIG. 2P which has the value "1" between the times $t_{32}$ and $t_{65}$, between $t_{96}$ and $t_{129}$, . . . and has the value "0" in the other periods, and the "and" gate circuit 54 is adapted to be open in the periods during which the rectangular wave R5 has the value "1." Accordingly, the pulse train CP1'' is obtained between the times $t_{32}$ and $t_{65}$, between $t_{96}$ and $t_{129}$, . . . as shown in FIG. 2Q. Further, the setting circuits 53a to 53d are designed so that their setting outputs $F_a$ to $F_d$ can be set from the outside in the form of different digital values but in the order of $F_a$, $F_b$, $F_c$ and $F_d$.

When the value of the counted ouptut G coincides with the setting outputs $F_a$, $F_b$, $F_c$ and $F_d$, respectively, coincidence outputs $H_a$, $H_b$, $H_c$ and $H_d$ are sequentially derived from the coincidence detecting circuits 51a, 51b, 51c and 51d, respectively and the coincidence output $H_a$ is applied to a reset terminal *r* of a flip-flop circuit 56a and a set terminal *s* of a flip-flop circuit 56b, the output $H_b$ a reset terminal *r* of the flip-flop circuit 56b and a set terminal *s* of a flip-flop circuit 56c, the output $H_c$ a reset terminal *r* of the flip-flop circuit 56c and a set terminal *s* of a flip-flop circuit 56d and the output $H_d$ a reset terminal *r* of the flip-flop circuit 56d. To a set terminal *s* of the flip-flop circuit 56a is applied the pulse P2 from the output terminal 22 of the timing signal generator circuit 17. Further, each of outputs $K_a$ to $K_d$ from "yes" output terminals *y* of the flip-flop circuits 56a to 56b is supplied to the one input line of each of "and" gate circuits 57a to 57d having two inputs. While, a zero level detecting circuit 58 is provided which is adapted to be supplied with the pulse P2 from the output terminal 22 of the timing signal generator circuit 17 and the compared output Q from the comparator circuit 12 and to obtain a detected output L each time supplied with the pulse P2, which output L has the value "1" from the time of obtaining the pulse P2 until the compared output Q is altered from "1" to "0" or "0" to "1" and has the value "0" in the other periods. The output L from the zero level detecting circuit 58 is supplied to the other input lines of the aforesaid "and" gate circuits 57a to 57d.

Further, four voltage sources 59a to 59d are provided corresponding to "and" gate circuits 57a to 57d and voltages $V_a$ to $V_d$ are applied from these voltage sources 59a to 59d to the input side of the amplifier 5 of the integration circuit 3 through switches 60a to 60d respectively and a common resistor 61. In this case, the switches 60a to 60d are adapted to be closed in the periods during which outputs $M_a$ to $M_d$ from the "and" gate circuits 57a to 57d have the value "1", respectively.

The foregoing has outlined the construction of the example shown in FIG. 4, which will be further described together with its operation in connection with the case where the input voltage $V_I$ is negative.

Each time the pulse P2 is obtained, the output L from the zero level detecting circuit 58 has the value "1" from the times $t_{32}$, $t_{96}$, . . . when the pulse $P_2$ is obtained to the time when the compared output Q is altered from "1" to "0" or "0" to "1." Accordingly, between the times $t_0$ and $t_{32}$, between $t_{64}$ and $t_{96}$, . . . the outputs $M_a$ to $M_d$ from the "and" gate circuits 57a to 57d have the value "0," so that the operations between the times $t_0$ and $t_{32}$, between $t_{64}$ and $t_{96}$, . . . are exactly the same as those in the example of FIG. 1. However, since the output L from the zero level detecting circuit 58 has the value "1" between the times $t_{32}$ and $t_{64}$, between $t_{96}$ and $t_{128}$, . . ., the following operation is obtained in addition to the operations previously described in connection with FIG. 1.

Assume that digital numbers such as, for example, "6," "10", "14" and "17" are set in the setting circuits 53a, 53b, 53c and 53d, respectively. Further, let it be assumed that a resistor 61 has a value R equal to that of the resistor 6, that the voltages $V_a$, $V_b$ and $V_c$ derived from the voltage sources 59a, 59b and 59c are negative, that the voltage $V_d$ derived from the voltage source 59d is positive and that the values of the voltages $V_a$ to $V_d$ relative to the voltage $V_P$ are preselected so that the following relationship may be obtained in relation to the voltage $E_K$ given by the aforesaid Equation (3).

$$-\frac{E_K}{4} = -\frac{1}{RC}\int_{t_0}^{t_{32}} (V_P - V_a)\,dt \qquad (20a)$$

$$-\frac{E_K}{2} = -\frac{1}{RC}\int_{t_0}^{t_{32}} (V_P - V_b)\,dt \qquad (20b)$$

$$-\frac{3}{4}\cdot E_K = -\frac{1}{RC}\int_{t_0}^{t_{32}} (V_P - V_c)\,dt \qquad (20c)$$

$$+\frac{39}{12} E_K = \frac{1}{RC}\int_{t_0}^{t_{32}} (V_P + V_d)\,dt \qquad (20d)$$

In such a case, the counter 52 counts pulses of the pulse train CP1''' from the time $t_{32}$ and at the time $t_{42}$ when the counter 52 has counted six pulses of the pulse train CP1''' the pulse output $H_a$ is derived from the coincidence detecting circuit 51*a* as depicted in FIG. $2R_a$. Similarly, at the times $t_{50}$, $t_{58}$ and $t_{64}$ when the counter 52 has counted 10, 14 and 17 pulses of the pulse train CP1'' from the time $t_{32}$ respectively, the outputs $H_b$, $H_c$ and $H_d$ are derived from the coincidence detecting circuits 51*b*, 51*c* and 51*d* as shown in FIGS. $2R_b$, $2R_c$ and $2R_d$, respectively. Accordingly, the outputs $K_a$, $K_b$, $K_c$ and $K_d$ derived at the "tes" output terminals *y* of the flip-flop circuits 56*a*, 56*b*, 56*c* and 56*d* are obtained in the form of the outputs "1" between the times $t_{32}$ and $t_{42}$, between $t_{42}$ and $t_{50}$, between $t_{50}$ and $t_{58}$ and between $t_{58}$, and $t_{64}$, as illustrated in FIGS. $2S_a$, $2S_b$, $2S_c$ and $2S_d$, respectively.

Further, since the compared output Q is "1" at the time $t_{32}$ as is the case with the foregoing example and is applied to the zero level detecting circuit 58, the output L therefrom is "1" from the time $t_{32}$ by the cooperation with the pulse P2 shown in FIG. 2F. Therefore, the output $M_a$ from the "and" gate circuit 57*a* is "1" from the time $t_{32}$, so that the switch 60*a* is closed from this time and the voltage $V_a$ is applied to the integration circuit 3.

Consequently, if the output L, that is, the compared output Q continues to have the value "1" from the time $t_{32}$ to $t_{42}$, only the output $M_a$ has the value "1" between the times $t_{32}$ and $t_{42}$ based on the output $K_a$ depicted in FIG. $2S_a$, so that the voltages $+V_P$ and $-V_a$ are integrated by the integration circuit 3 between the times $t_{32}$ and $t_{42}$. Since the integrated output E derived at the output terminal 8 of the integration circuit 3 at the time $t_{32}$ is given by the following Equation (21) similar to the aforementioned (1), the integrated output E (hereinafter referred to as $E_{42}$) obtained at the time $t_{42}$ has a value given by the following Equation (22).

$$+E_{32}=+\frac{1}{RC}\int_{t_0}^{t_{32}} V_I dt \qquad (21)$$

$$+E_{42}=+E_{32}-\frac{1}{RC}\int_{t_{32}}^{t_{42}} (V_P-V_a)dt \qquad (22)$$

If the output L from the zero level detecting circuit 58 has the value "1" between the times $t_{42}$ and $t_{50}$, only the output $M_b$ has the value "1" between the times $t_{42}$ and $t_{50}$ based on the output $K_b$ depicted in FIG. $2S_b$ to close only the switch $\mathbf{60}_b$ between the times $t_{42}$ and $t_{50}$, during which the voltages $+V_P$ and $-V_b$ are integrated by the integration circuit 3 and the integrated output E (hereinafter referred to as $E_{50}$) therefrom at the time $t_{50}$ has a value given by the following equation.

$$+E_{50}=+E_{42}-\frac{1}{RC}\int_{t_{42}}^{t_{50}} (V_P-V_b)dt \qquad (23)$$

Further, if the output L has the value "1" between the times $t_{50}$ and $t_{58}$, only the output $M_c$ has the value "0" between the times $t_{50}$ and $t_{58}$ based on the output $K_c$ shown in FIG. $2S_c$, so that the switch $\mathbf{60}_c$ is closed between the times $t_{50}$ and $t_{58}$, during which the voltages $+V_P$ and $-V_c$ are integrated by the integration circuit 3 and the integrated output E (hereinafter be referred to as $E_{58}$) derived therefrom at the time $t_{58}$ has a value given by the following equation.

$$+E_{58}=+E_{50}-\frac{1}{RC}\int_{t_{50}}^{t_{58}} (V_P-V_c)dt \qquad (24)$$

Then, if the output L has the value "1" between the times $t_{58}$ and $t_{59}$, only the output $M_d$ has the value "1" between the times $t_{58}$ and $t_{59}$ based on the output $K_d$ depicted in FIG. $2S_d$, so that the switch 60*d* is closed between the times $t_{58}$ and $t_{59}$. In this case, if the integration circuit 3 is not held reset by the reset pulse P4 of FIG. 2H between the times $t_{63}$ and $t_{64}$, the voltages $+V_P$ and $+V_d$ are integrated by the integration circuit 3 between the times $t_{58}$ and $t_{64}$ and the integrated output E (hereinafter referred to as $E_{64}$) has a value given by the following equation at the time $t_{64}$.

$$E_{64}=+E_{58}-\frac{1}{RC}\int_{t_{58}}^{t_{64}} (V_P+V_d)dt \qquad (25)$$

In this case, however, the voltages $V_a$ to $V_d$ are selected to satisfy the Equations (20*a*) to (20*d*) in relation to the voltage $V_P$, numbers such as "6," "10," "14" and "17" are set in the setting circuits 53*a* to 53*d* respectively and the time intervals between the times $t_{32}$ and $t_{42}$, between $t_{42}$ and $t_{50}$, between $t_{50}$ and $t_{58}$ and between $t_{58}$ and $t_{64}$ are set to be $10\cdot\tau_1$, $8\cdot\tau_1$, $8\cdot\tau_1$ and $6\cdot\tau_1$, respectively, as will become apparent from the following description. Accordingly, if the output $|-E_K|$ is equal to a maximum value of the output $|+E_{32}|$, the output $E_{64}$ has the value "0."

Further, if the output L becomes "0" at a certain time $t_a$ between the times $t_{32}$ and $t_{42}$, only the output $M_a$ becomes "1" between the times $t_{32}$ and $t_a$, so that the voltages $V_P$ and $-V_a$ are integrated between the times $t_{32}$ and $t_a$ and the integrated output E (hereinafter referred to as $E_a$) at the time $t_a$ has a value given by the following equation and becomes zero.

$$E_a=+E_{32}-\frac{1}{RC}\int_{t_{32}}^{t_a} (V_P-V_a)dt=0 \qquad (26)$$

Thus, when the compared output Q has the value "0" at the time $t_a$, the output L has the value "0" after the time $t_a$. Thereafter, any of the outputs $M_a$ to $M_d$ does not become "1" after the time $t_a$, and hence any of the switches 59*a* to 59*d* is not closed after the time $t_a$. As a result of this, only the voltage $+V_P$ is integrated by the integration circuit 3 between the times $t_a$ and $t_{48}$ and the integrated output E at the time $t_{48}$ has a value $E_{48}$ given by the following equation.

$$-E_{48}=-\frac{1}{RC}\int_{t_a}^{t_{48}} V_P dt \qquad (27)$$

Further, after the operation has thus been achieved until the time $t_{48}$, the output L from the zero level detecting circuit 58 does not become "1" between the times $t_{48}$ and $t_{64}$ as previously described, so that any of the outputs $M_a$ to $M_d$ does not come to have the value "1" between the times $t_{48}$ and $t_{64}$ and any of the switches 60a to 60d is not closed. Accordingly, the same integration as above described is achieved and the integrated output E at the time $t_{56}$ has a value $E_{56}$ given by the following Equation (28). If the output $E_{56}$ at the time $t_{56}$ is positive or zero, the output E obtained at the time $t_{60}$ has a value given by the following Equation (29*a*) or (29*a'*) and if negative, the output E has a value $E_{60}$ given by the following Equation (29*b*). Further, if the output $E_{60}$ at the time $t_{60}$ is positive or zero, the output E obtained at the time $t_{62}$ has a value $E_{60}$ given by the following Equation (30*a*) or (30*a'*) and if negative, the output E has a value $E_{62}$ given by the following Equation (30*b*). Moreover, the output E obtained at the time $t_{63}$ has a value $E_{63}$ expressed by the following Equation (31*a*) or (31*a'*) or (31*b*) according as the output $E_{62}$ at the time $t_{62}$ is positive or zero or negative.

$$E_{56}=-E_{48}+\frac{1}{RC}\int_{t_{48}}^{t_{56}} V_N dt \quad (28)$$

$$E_{60}=+E_{56}-\frac{1}{RC}\int_{t_{56}}^{t_{60}} V_P dt \quad (29a)$$

$$-E_{60}=-\frac{1}{RC}\int_{t_{56}}^{t_{60}} V_P dt \quad (29a')$$

$$E_{60}=-E_{56}+\frac{1}{RC}\int_{t_{56}}^{t_{60}} V_N dt \quad (29b)$$

$$E_{62}=+E_{60}-\frac{1}{RC}\int_{t_{60}}^{t_{62}} V_P dt \quad (30a)$$

$$-E_{62}=-\frac{1}{RC}\int_{t_{60}}^{t_{62}} V_P dt \quad (30a')$$

$$E_{62}=-E_{60}+\frac{1}{RC}\int_{t_{60}}^{t_{62}} V_N dt \quad (30b)$$

$$E_{63}=+E_{62}-\frac{1}{RC}\int_{t_{62}}^{t_{63}} V_P dt \quad (31a)$$

$$-E_{63}=\frac{1}{RC}\int_{t_{62}}^{t_{63}} V_P dt \quad (31a')$$

$$E_{63}=-E_{62}+\frac{1}{RC}\int_{t_{62}}^{t_{63}} V_N dt \quad (31b)$$

In the case where the output L has the value "0" at a time $t_b$ between the times $t_{42}$ and $t_{48}$ after the integrated output $E_{42}$ of the Equation (22) has been obtained at the time $t_{42}$ as above described, the voltages $+V_P$ and $-V_b$ are similarly integrated between the times $t_{42}$ and $t_b$ and the integrated output E (hereinafter referred to as $E_b$) at the time $t_b$ has a value given by the following equation and is zero.

$$E_b=+E_{42}-\frac{1}{RC}\int_{t_{42}}^{t_b}(V_P-V_b)dt=0 \quad (32)$$

When the output L has thus become "0" at the time $t_b$, the voltage $+V_P$ is integrated between the times $t_b$ and $t_{48}$ in the same manner as that in the foregoing and at the time $t_{48}$ the output E is provided to have a value expressed by the following Equation (33).

$$-E_{48}=-\frac{1}{RC}\int_{t_b}^{t_{48}} V_P dt \quad (33)$$

After the operation has thus been carried out until the time $t_{48}$, the output $E_{56}$ based on the Equation (28), the output $E_{60}$ based on the Equation (29*a*), (29*a'*) or (29*b*), the output $E_{62}$ based on the equation (30*a*), (30*a'*) or (30*b*) and the output $E_{63}$ based on the Equation (31*a*), (31*a'*) or (31*b*) are obtained at the times $t_{56}$, $t_{60}$, $t_{62}$ and $t_{63}$, respectively in the same manner as that above described.

Further, after the integrated output $E_{42}$ has been obtained at the time $t_{42}$ as above described, if the output L has the value "0" at a time $t_b'$ between the times $t_{48}$ and $t_{50}$, the voltage $+V_P$ is similarly integrated between the times $t_{42}$ and $t_b'$ and the output voltage E (hereinafter referred to as $E_b'$) at the time $t_b'$ is provided to have a value given by the following equation which is zero.

$$E_b'=+E_{42}-\frac{1}{RC}\int_{t_{42}}^{t'_b}(V_P-V_b)dt=0 \quad (34)$$

When the output L has thus become "1" at the time $t_b'$, the voltage $+V_P$ is likewise integrated between the times $t_b'$ and $t_{56}$ and the output E is provided to have a value given by the following Equation (35) at the time $t_{56}$.

$$-E_{56}=-\frac{1}{RC}\int_{t'_b}^{t_{56}} V_P dt \quad (35)$$

After the operation has thus proceeded to the time $t_{56}$, the outputs $E_{60}$, $E_{62}$ and $E_{63}$ are obtained at the times $t_{60}$, $t_{62}$ and $t_{63}$, respectively based on the Equations (29*b*), (30*a*), (30*a'*) or (30*b*) and (31*a*), (31*a'*) or (31*b*) in the same manner as that above described.

In the event that the output L comes to have the value "0" at a time $t_c$ between the times $t_{50}$ and $t_{56}$ after the output $E_{50}$ at the time $t_{50}$ has been obtained based on the Equation (23), the voltages $+V_P$ and $-V_c$ are integrated between the times $t_{50}$ and $t_c$ to provide the integrated output E of a value given by the following Equation (36) at the time $t_c$. In such a case, the voltage $+V_p$ is integrated between the times $t_c$ and $t_{56}$ to provide the output $-E_{56}$ given by the following Equation (37) at the time $t_{56}$ and thereafter the outputs $E_{60}$, $E_{62}$ and $E_{63}$ are obtained at the times $t_{60}$, $t_{62}$ and $t_{63}$, respectively based on the equations (29*b*), (30 *a*), (30*a'*) or (30*b*) and (31*a*), (31*a'*) or (31*b*) as is the case with the foregoing.

$$E_c = +E_{50} - \frac{1}{RC}\int_{t_{50}}^{t_c} (V_P - V_c)dt = 0 \qquad (36)$$

$$-E_{56} = -\frac{1}{RC}\int_{t_c}^{t_{56}} V_P dt \qquad (37)$$

Where the output L becomes "0" at a time $t_c'$ between the times $t_{56}$ and $t_{58}$ after the output $E_{50}$ at the time $t_{50}$ has been obtained based on the Equation (23) as above described, the voltages $+V_P$ and $-V_c$ are integrated between the times $t_{50}$ and $t_c'$ to provide the output E having a value given by the following Equation (38) at the time $t_c'$ and then the voltage $+V_P$ is integrated between the times $t_c'$ and $t_{60}$ to provide an output $-E_{60}$ given by the following Equation (39) at the time $t_{60}$. Thereafter, outputs $E_{62}$ and $E_{63}$ based on the equations (30*b*) and (31*a*), (31*a'*) or (31*b*) are similarly obtained at the times $t_{62}$ and $t_{63}$ , respectively.

$$E_c' = +E_{50} - \frac{1}{RC}\int_{t_{50}}^{t'_c} (V_P - V_c)dt = 0 \qquad (38)$$

$$-E_{60} = -\frac{1}{RC}\int_{t'_c}^{t_{60}} V_P dt \qquad (39)$$

Where the output L has the value "0" at a time $t_d$ between the times $t_{58}$ and $t_{60}$ after the output $E_{58}$ at the time $t_{58}$ has been obtained based on the Equation (24) as above described, an output $E_d$ is obtained at the time $t_d$ based on the following Equation (40), an output $E_{60}$ at the time $t_{60}$ based on the following Equation (41), the output $E_{62}$ at the time $t_{62}$ based on the Equation (32*b*) and the output $E_{63}$ at the time $t_{63}$ based on the Equation (31*a*), (31*a'*) or (31*b*). If the output E has the value "0" at the time $t_d'$ between the times $t_{60}$ and $t_{62}$ after the output $E_{58}$ has been obtained based on the Equation (24) at the time $t_{58}$ as above described, an output $E_d'$ based on the following Equation (42), an output $E_{62}$ based on the following Equation (43) and the output $E_{63}$ based on the equation (31*b*) are obtained at the times $t_d'$, $t_{62}$ and $t_{63}$, respectively. If the output L becomes "0" at a time $t_d''$ between the times $t_{62}$ and $t_{63}$ after the output $E_{58}$ based on the Equation (24) has been obtained from the time $t_{58}$, outputs $E_d''$ and $-E_{63}$ given by the following Equations (44) and (45) are obtained at the times $t_d''$ and $t_{63}$, respectively.

$$E_d = E_{58} - \frac{1}{RC}\int_{t_{58}}^{t_d} (V_P + V_d)dt = 0 \qquad (40)$$

$$-E_{60} = -\frac{1}{RC}\int_{t_d}^{t_{60}} V_P dt \qquad (41)$$

$$E_d' = E_{58} - \frac{1}{RC}\int_{t_{58}}^{t'_d} (V_P + V_d)dt = 0 \qquad (42)$$

$$-E_{62} = -\frac{1}{RC}\int_{t'_d}^{t_{62}} V_P dt \qquad (43)$$

$$E_d'' = E_{58} - \frac{1}{RC}\int_{t_{58}}^{t''_d} (V_P + V_d)dt = 0 \qquad (44)$$

$$-E_{63} = \frac{1}{RC}\int_{t''_d}^{t_{63}} V_P dt \qquad (45)$$

After the time $t_{64}$, the times $t_{108}$, $t_{114}$, $t_{122}$ and $t_{128}$; $t_{172}$, $t_{178}$, $t_{186}$ and $t_{198}$; . . . correspond to $t_{42}$, $t_{50}$, $t_{58}$ and $t_{64}$ and the same operations as those above described are achieved.

In the periods during which the output R3 from the flip-flop circuit 13 has the value "0," the pulse train CP1'' are derived from the "and" gate circuit 37 as is the case with the foregoing example and the pulses of the pulse train CP1'' are counted by the counter 42 and the number of pulses counted by the counter 42 is indicated by the indicator 43 as is the case with the foregoing example.

Accordingly, the number of pulses counted by the counter 42 is obtained in such a form that the integrated output $+E_{32}$ of the Equation (21) has been corrected according to its value. Namely, in the example of FIG. 1, the input voltage $V_l$ is constant and the input voltage $V_l$ and the counting number N of the counter 42 bear the relationship given by the Equation (11) and indicated by I in FIG. 3. In the example of FIG. 4, in the range of N = 0 to N = (6−1) = 5 the value of the input voltage $V_l$ is obtained with the relationship given by the following Equation (46) and indicated by a line $II_a$ in FIG. 3.

$$|V_l| = \tfrac{1}{4}N \qquad (46)$$

In the range of N = 5 to N = (10−1) = 9 the value of the input voltage $V_l$ is obtained with the relationship given by the following Equation (47) and indicated by a line $II_b$ in FIG. 3.

$$|V_l| = \tfrac{1}{2}N - (\tfrac{1}{2}\times 5 - \tfrac{1}{4}\times 5) = \tfrac{1}{2}N - 5/4 \qquad (47)$$

In the range of N = 9 to N = (14−1) = 13 the value of the input voltage $V_l$ is obtained with the relationship given by the following Equation (48) and indicated by a line $II_c$ in FIG. 3.

$$|V_l| = \tfrac{3}{4}N - \{\tfrac{3}{4}\times 9 - (\tfrac{1}{2}\times 9 - 4/5)\} = \tfrac{3}{4}N - 7/2 \qquad (48)$$

In the range of N = 13 to N = (17−1) = 16 the value of the input voltage $V_l$ is obtained with the relationship given by the following Equation (49) and indicated by a line $II_d$ in FIG. 3.

$$|V_l| = 39/12N - \{39/12 \times 13 - (3/4 \times 13 - 7/2)\} = 39/12N - 36 \quad (49)$$

This will become more apparent from the following concrete example.

Let it be assumed that the input voltage $-V_l$ is constant and that the output voltage $+E_{32}$ expressed by the Equation (21) is equal to the value in the case where the indication "−16V" is provided in the example of FIG. 1. In such a case, the integrated output E increases in the positive direction from the time $t_0$ to reach a point $X7_0$ at the time $t_{32}$ at which the output voltage $+E_{32\text{-}7}$ based on the Equation (21) is obtained, as indicated by a line $U7_0$ in FIG. 2T, from thence the output E increases in the negative direction to reach a point $X7_1$ at the time $t_{42}$ at which the output $+E_{42\text{-}7}$ based on the Equation (22) is obtained, as indicated by a line $U7_1$, from thence the output E increases in the negative direction to reach a point $X7_2$ at the time $t_{50}$ at which the output $+E_{50\text{-}7}$ based on the Equation (23) is obtained, as indicated by a line $U7_2$, from thence the output E increases in the negative direction to reach a point $X7_3$ at the time $t_{58}$ at which the output $+E_{58\text{-}7}$ based on the Equation (24) is obtained, as indicated by a line $U7_3$, and from thence the output E further increases in the negative direction to reach a point $X7_4$ at the time $t_{64}$ at which the output $E_{64\text{-}7} = 0$ based on the Equation (25) is obtained, as indicated by a line $U7_4$, unless the switch 9 of the integration circuit 3 is closed between the times $t_{63}$ and $t_{64}$. In this case, the compared output Q, the output R3 from the flip-flop circuit 13, the output R4 from the flip-flop circuit 14 and the pulse train CP1'' from the "and" gate circuit 37 are obtained as shown in FIGS. $2K_7$, $2L_7$, $2N_7$ and $2M_7$. Further, the output L from the zero level detecting circuit 58 and the outputs $M_a$ to $M_d$ from the "and" gate circuits 57*a* to 57*d* are obtained as depicted in FIGS. $2V_7$ and $2Ua_7$ to $2Ud_7$, respectively.

Consequently, the counter 42 16 pulses in all between the times $t_0$ and $t_{64}$ and the indicator 43 provides an indication "−16V." Also between the times $t_{64}$ and $t_{128}$, between $t_{128}$ and $t_{192}$, . . . the indicator 43 provides the indication "−16V." This implies that the input voltage $-V_l$ has been corrected from its original value (although the values are equal to each other in the present example) for the following reason. Namely, in the present example the voltage $+E_{32}$ is the same as that in the case where the indication "−16V" is obtained in the example of FIG. 1 and if the value "16" being indicated is substituted for the value of N in the Equation (49), it follows that $V_l = 0$.

Assuming that the input voltage $V_1$ is a negative constant voltage and that the output voltage $+E_{32}$ expressed by the Equation (21) is one-fourth times smaller than that the indication "−16V" is obtained in the example of FIG. 1, the integrated output E increases in the positive direction from the time $t_0$ to reach a point $X8_0$ at the time $t_{32}$ at which the output $+E_{32\text{-}8}$ based on the Equation (21) is obtained, as indicated by a line $U8_0$, from thence the output E increases in the negative direction to reach a point $X8_1$ at the time $t_{42}$ at which the output $+E_{42\text{-}8}$ based on the Equation (22) is obtained, as indicated by a line $U8_1$, from thence the output E increases in the negative direction to reach a point $X8_2$ at the time $t_{50}$ at which the output $E_{50\text{-}8}$ based on the Equation (25) is obtained, as indicated by a line $U8_2$, from thence the output E increases in the negative direction to reach a point $X8_3$ (the point of the time $t_c$) at which the output $E_{c\text{-}8} = 0$ based on the Equation (36) is obtained, as indicated by a line $U8_3$, from thence the output E increases in the negative direction to reach a point $X8_4$ at the time $t_{56}$ at which the output $-E_{56\text{-}8}$ based on the Equation (37) is obtained, as indicated by a line $U8_4$, from thence the output E increases in the positive direction to reach a point $X8_5$ at the time $t_{60}$ at which the output $E_{60\text{-}8}$ (the value of "0" in the present example) based on the Equation (29*b*) is obtained, as indicated by a line $U8_5$, from thence the output E increases in the negative direction to reach a point $X8_6$ at the time $t_{62}$ at which the output $-E_{62\text{-}8}$ based on the Equation (30*a'*) is obtained, as indicated by a line $U8_6$, and from thence the output E increases in the positive direction to reach a point $X8_7$ at the time $t_{63}$ at which the output $+E_{63\text{-}8}$ based on the Equation (31*b*) is obtained, as indicated by a line $U8_7$ and the output E has the value "0" between the times $t_{63}$ and $t_{64}$. In this case, the compared output Q, the output R3 from the flip-flop circuit 13, the output R4 from the flip-flop circuit 14 and the pulse train CP1'' from the "and" gate circuit 37 are obtained as illustrated in FIGS. $2K_8$, $2L_8$, $2N_8$ and $2M_8$, respectively. Further, the output L from the zero level detecting circuit 58 and the outputs $M_a$ to $M_d$ from the "and" gate circuits 57*a* to 57*d* are obtained as depicted in FIGS. $2V_8$ and $2Ua_8$ to $2Ud_8$, respectively.

Consequently, the counter 42 counts 10 pulses in all between the times $t_0$ and $t_{64}$ and the indicator 43 provides an indication "−10V." Also between the times $t_{64}$ and $t_{128}$, between $t_{128}$ and $t_{192}$, . . . the indication "−10V" is similarly provided by the indicator 43. In the present example, the voltage $+E_{32}$ is one-fourth times lower than that in the case where the indication "−16V" is provided in FIG. 1 and if the value of "10" being indicated is substituted for the value of N in the Equation (48), it follows that $V_l = 4$. Accordingly, the indication "−10V" implies that the input voltage $-V_l$ has been corrected from its original value.

Namely, in the example of FIG. 1 the value of the input voltage $-V_l$ is indicated as "−4V," while in the example of FIG. 4 it is indicated as "−10V" after corrected.

The foregoing description has been made in connection with only two examples of this invention in which the value of the input voltage $-V_l$ is constant but even if the value of the input voltage $V_l$ is positive or negative and even if its absolute value is any other than the aforementioned, a digital value representative of the corrected input voltage $V_l$ can similarly be obtained. However, in the case of the input voltage $V_l$ such that the value N obtained by putting a numerical value in $V_l$ of the aforesaid Equations (46) to (49) is not an integer, the value N based on the Equations (46) to (49) is obtained in such a form that fractions of 5 and over are counted as a unit and the rest is cut away under the decimal point.

Thus, in the present example, it is possible to obtain the digital value N corresponding to the value of the input voltage $V_l$ but corrected in accordance therewith and it will be seen that the relationship between $V_I$ and N depends on the broken line characteristic shown in FIG. 3.

The foregoing examples are intended as being illustrative and not as limiting the present invention specifically thereto. For example, the inverter circuit 41 may be omitted, in which case an output R3′ similar to that derived from the inverter circuit 41 is obtained at the "not" output terminal *n* (not shown) of the flip-flop circuit 13. In the foregoing the time for integration (referred to as $T_c$) of the input voltage $V_I$ is the time $\tau_1 \cdot 32$ between the times $t_0$ and $t_{32}$ but the present invention is also applicable to the case where $T_c$ uses $\beta \cdot \tau_1 \cdot 32$, $\beta$ being a constant. In the foregoing the periods of time for sequential integration of the reference voltage are taken as $T_1, T_2, \ldots$ and the integration is achieved using $T_1$ as the reference therefor and with the relationship: $T_2 = T_1/2$, $T_3 = T_1/4$, $T_4 = T_1/8$, $T_5 = T_1/16$ but if $j = 2, 3, \ldots n$, the value $n$ can be set at a desired integer with a relationship $T_j = T_1/2^{j-1}$. In the case of the broken line characteristic, the number of its broken points can be set as desired and the values of the broken points, that is, the polarities and values of the voltages $V_a$ to $V_d$ can also be set at will and, further, the values of the resistors 6 and 61 can be selected different from each other.

It will be apparent that many modifications and variations may be effected without departing from the scope of the novel concepts of this invention.

I claim as my invention:

1. An analog to digital converter comprising in combination:

a. an integrating amplifier means, b. a source of clock pulses, c. a timing signal generator that produces timing pulses that define for each conversion cycle a series of time intervals the first and second of which are selected portions of a conversion cycle and each of the remainder of which is half the preceding interval, d. means for applying a signal of unknown amplitude and polarity to said integrating amplifier only during the first timing interval of each conversion cycle to obtain an amplifier output representative of the unknown signal, e. means for applying signals of known amplitude and polarity to said amplifier during the second and each of the following time intervals to reduce the amplifier output toward zero, and f. means for counting the clock pulses during those time intervals following the second interval and during only those time intervals in which the polarity of the amplifier output at the start of the interval is the same as the polarity of the amplifier output at the end of said first time interval.

2. An analog to digital converter according to claim 1 in which said timing signal generator is controlled by the clock pulse generator and provides timing signals marking the beginning and end of each of said time intervals and of the conversion cycle.

3. In an analog to digital converter according to claim 1, a flip-flop circuit, means responsive to the polarity of the amplifier output for conditioning the flip-flop circuit, means for triggering the flip-flop circuit from said timing signal generator, and means responsive to the flip-flop circuit for selecting the polarity of the known amplitude signals for each time interval.

4. In an analog-to-digital converter according to claim 1, a digital indicator and means for supplying the digital indicator with a counted output from the pulse counting means and in which a digital value is indicated by the digital indicator corresponding to the integrated output at the time of completion of integration of the analog input signal with the integrating means.

5. In an analog to digital converter according to claim 1, a source of supplementary signals of known amplitude and polarity, means connected to said source for applying the supplementary signals to said amplifier during a time interval starting with the start of the second time interval and terminating upon a reversal of the polarity of the output of the amplifier.

6. In an analog to digital converter according to claim 1 at least one source supplying a supplementary signal of known amplitude and polarity, presettable counting means connected to indicate selected counts of the series of clock pulses of each conversion cycle, and switch means arranged to connect said supplementary source to the amplifier during a time interval determined at least in part by the accumulation of selected counts in said presettable counting means.

* * * * *